(12) United States Patent
Badehi

(10) Patent No.: US 6,646,289 B1
(45) Date of Patent: Nov. 11, 2003

(54) INTEGRATED CIRCUIT DEVICE

(75) Inventor: Avner Badehi, Nataf (IL)

(73) Assignee: Shellcase Ltd., Jerusalem (IL)

( * ) Notice: Subject to any disclaimer, the term of this patent is extended or adjusted under 35 U.S.C. 154(b) by 0 days.

(21) Appl. No.: 09/601,895

(22) PCT Filed: Feb. 3, 1999

(86) PCT No.: PCT/IL99/00071

§ 371 (c)(1),
(2), (4) Date: Sep. 22, 2000

(87) PCT Pub. No.: WO99/40624

PCT Pub. Date: Aug. 12, 1999

(30) Foreign Application Priority Data

Feb. 6, 1998 (IL) .................................................. 123207

(51) Int. Cl.[7] .......................... H01L 27/15; H01L 31/12; H01L 33/00; H01L 21/00; H01L 21/44
(52) U.S. Cl. ............................. 257/81; 257/98; 257/99; 257/294; 257/432; 257/434; 257/448; 257/466; 257/681; 438/27; 438/29; 438/33; 438/38; 438/65; 438/68; 438/69; 438/70; 438/71; 438/72; 438/116
(58) Field of Search ............................... 257/81, 98, 99, 257/225, 228, 294, 323, 432, 434, 447, 448, 460, 466, 680, 681; 438/27, 29, 33, 38, 61, 65, 68–72, 113, 114, 116, 125, 464, 465, 763, 780, 928, 956, 958, 978

(56) References Cited

U.S. PATENT DOCUMENTS

| | | | |
|---|---|---|---|
| 2,507,956 A | 5/1950 | Bruno et al. | |
| 2,796,370 A | 6/1957 | Ostrander et al. | |
| 2,851,385 A | 9/1958 | Spruance et al. | |
| 3,981,023 A | 9/1976 | King et al. | |
| 4,259,679 A | 3/1981 | Knibb et al. | |
| 4,279,690 A | 7/1981 | Dierschke | |
| 4,339,689 A | 7/1982 | Yamanaka et al. | |
| 4,797,179 A | 1/1989 | Watson et al. | |
| 4,933,601 A | 6/1990 | Sagawa et al. | |
| 5,118,924 A | 6/1992 | Mehra et al. | |
| 5,124,543 A | * | 6/1992 | Kawashima |
| 5,177,753 A | * | 1/1993 | Tanaka |
| 5,250,462 A | | 10/1993 | Sasaki et al. |
| 5,266,501 A | | 11/1993 | Imai |
| 5,321,303 A | | 6/1994 | Kawahara et al. |
| 5,526,449 A | | 6/1996 | Meade et al. |
| 5,595,930 A | | 1/1997 | Baek |
| 5,672,519 A | | 9/1997 | Song et al. |
| 5,677,200 A | | 10/1997 | Park et al. |
| 5,986,746 A | * | 11/1999 | Metz et al. |
| 6,235,141 B1 | * | 5/2001 | Feldman et al. |

* cited by examiner

Primary Examiner—David E. Graybill
(74) Attorney, Agent, or Firm—Edwards & Angell, LLP; David G. Conlin; John J. Penny, V

(57) ABSTRACT

An integrally packaged optronic integrated circuit device (310) including an integrated circuit die (322) containing at least one of a radiation emitter and radiation receiver and having top and bottom surfaces formed of electrically insulative and mechanically protective material, at least one of the surfaces (317) being transparent to radiation, and electrically insulative edge surfaces (314) having pads.

23 Claims, 23 Drawing Sheets

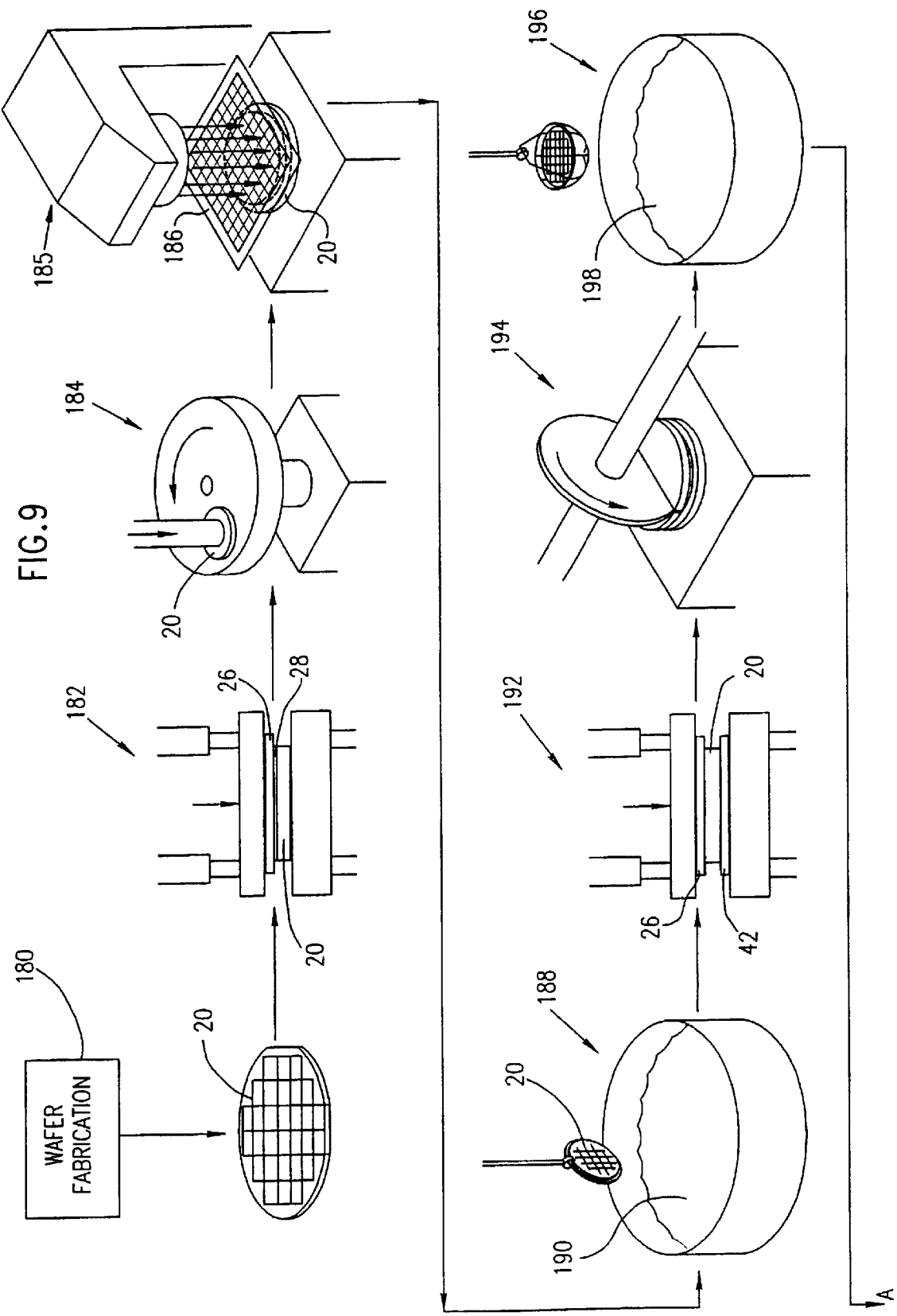

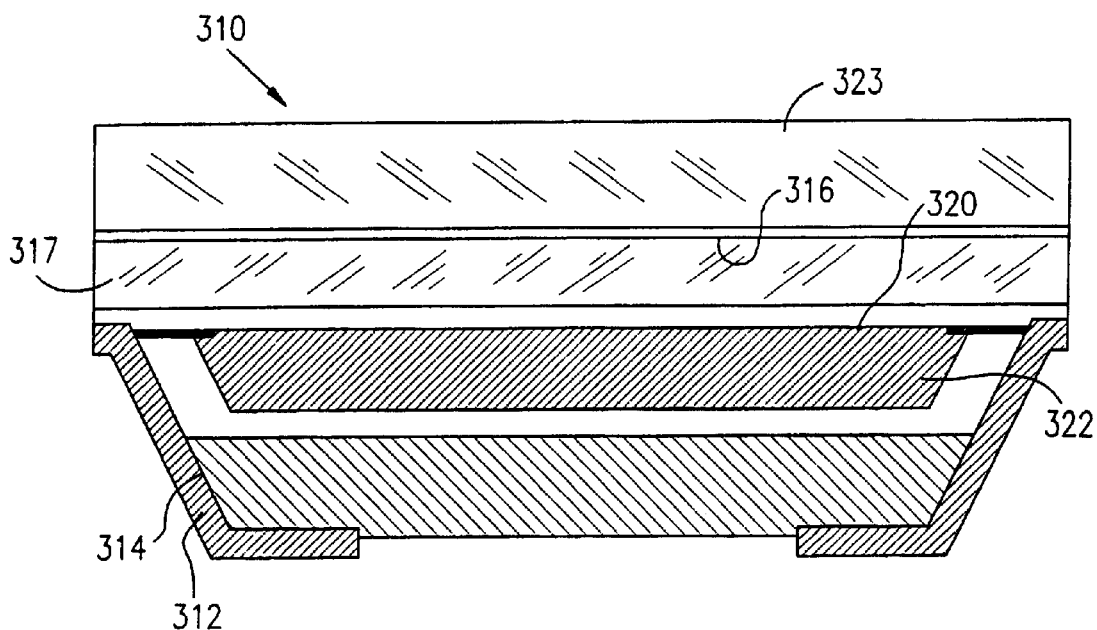
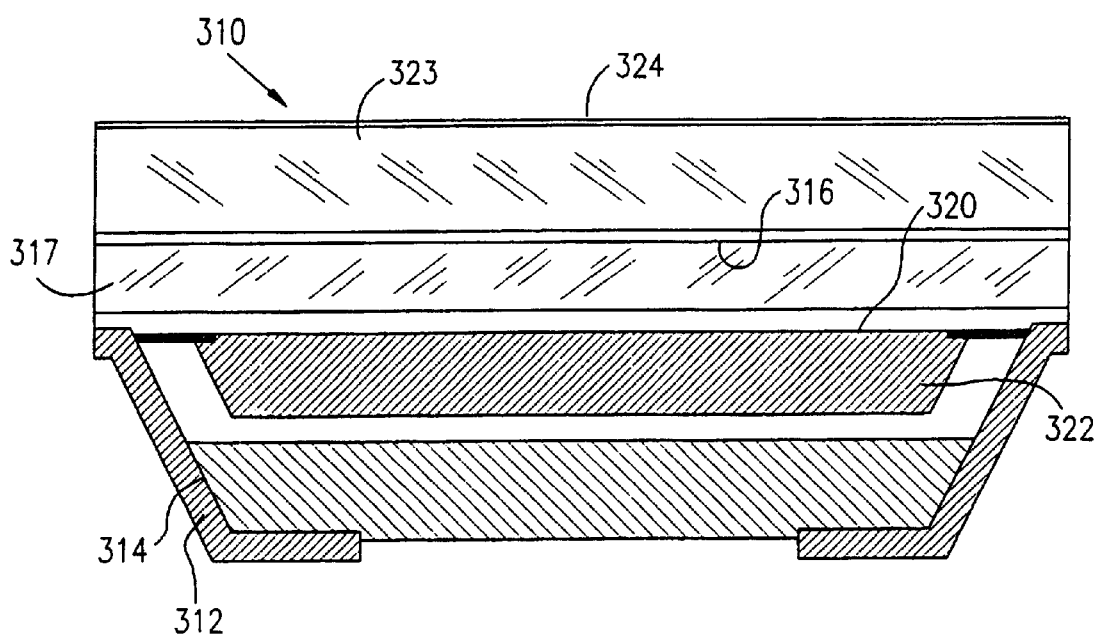

INTEGRATED CIRCUIT DEVICE

FIELD OF THE INVENTION

The present invention relates to methods and apparatus for producing integrated circuit devices and to integrated circuit devices produced thereby and more particularly to an optronic integrally packaged die.

BACKGROUND OF THE INVENTION

An essential step in the manufacture of all integrated circuit devices is known as "packaging" and involves mechanical and environmental protection of a silicon chip which is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder bumps as well as in thermal expansion mismatching, which limits the use of available substrates to silicon or materials which have thermal expansion characteristics similar to those of silicon.

Optronic packages for semiconductors are known. Conventional optronic packages used for imaging employ a ceramic housing onto which is sealingly mounted a transparent window. Optronic packages used for low level imaging, light emission and radiation detection, including light detection, employ a clear plastic enclosure.

Described in applicant's published PCT Application WO 95/19645 are methods and apparatus for producing integrated circuit devices, including, inter alia, integrally packaged dies having a radiation transparent protective layer.

SUMMARY OF THE INVENTION

The present invention seeks to provide optronic integrated circuit devices which are extremely compact as well as apparatus and techniques for the production thereof.

There is thus provided in accordance with a preferred embodiment of the present invention an integrally packaged optronic integrated circuit device including:

an integrated circuit die containing at least one of a radiation emitter and radiation receiver and having top and bottom surfaces formed of electrically insulative and mechanically protective material, at least one of the surfaces being transparent to radiation, and electrically insulative edge surfaces having pads.

Preferably, the device also includes at least one spectral filter associated with a radiation transparent protective surface thereof.

Additionally in accordance with a preferred embodiment of the present invention, the device includes a semiconductor substrate which is sufficiently thin as to enable to device to be responsive to back illumination.

Preferably, the device also includes at least one color filter associated with a radiation transparent protective surface thereof.

Further in accordance with a preferred embodiment of the present invention, lenses may be integrally formed on a transparent protective surface of the device.

Additionally in accordance with a preferred embodiment of the present invention, light coupling bumps may be integrally formed on a transparent protective surface of the device.

Further in accordance with a preferred embodiment of the present invention a waveguide and other optical components integrally formed on a transparent protective surface of the device.

Additionally in accordance with a preferred embodiment of the present invention, an optical grating may be integrally formed on a transparent protective surface of the device.

Further in accordance with a preferred embodiment of the present invention a polarizer may be formed on a transparent protective surface of the device.

There is also provided in accordance with a preferred embodiment of the present invention an integrally packaged optronic integrated circuit device including:

an integrated circuit die containing at least one of a radiation emitter and radiation receiver and having top and bottom surfaces formed of electrically insulative and mechanically protective material, at least one of the surfaces being transparent to radiation, the integrally packaged optronic integrated circuit device being characterized in that its longest dimension does not exceed the longest dimension of the die by more than 20%. Preferably the integrally packaged optronic integrated circuit device is characterized in that its longest dimension does not exceed the longest dimension of the die by more than 10%. More preferably the integrally packaged optronic integrated circuit device is characterized in that its longest dimension does not exceed the longest dimension of the die by more than 5%.

There is also provided in accordance with a preferred embodiment of the present invention a method for producing an integrally packaged optronic integrated circuit device comprising the steps of:

forming electrical circuits onto a semiconductor wafer;

forming at least one transparent mechanical protective layer onto said semiconductor wafer over said electrical circuits;

forming solderable contacts onto said semiconductor wafer; and thereafter, dicing said wafer into individual packaged dies.

BRIEF DESCRIPTION OF THE DRAWINGS

The present invention will be understood and appreciated more fully from the following detailed description, taken in conjunction with the drawings in which:

FIGS. 9, 10A and 10B together provide a simplified block diagram illustration of apparatus for carrying out the method of the present invention;

FIGS. 11A, 11B, 11C, 11D an 11E a simplified pictorial illustrations of five alternative embodiments of an integrated circuit device constructed and operative in accordance with yet another preferred embodiment of the present invention and including spectral filters and/or anti-reflective coatings;

FIGS. 15A and 5B are simplified pictorial illustration of two alternative embodiments of an integrally packaged optronic integrated circuit device constructed and operative in accordance with another preferred embodiment of the present invention having light coupling bumps integrally formed on a transparent protective surface thereof;

DETAILED DESCRIPTION OF PREFERRED EMBODIMENTS

Reference is now made to FIGS. 1A–22, which illustrate the production of integrated circuit devices in accordance with a preferred embodiment of the present invention.

Figure 1A:
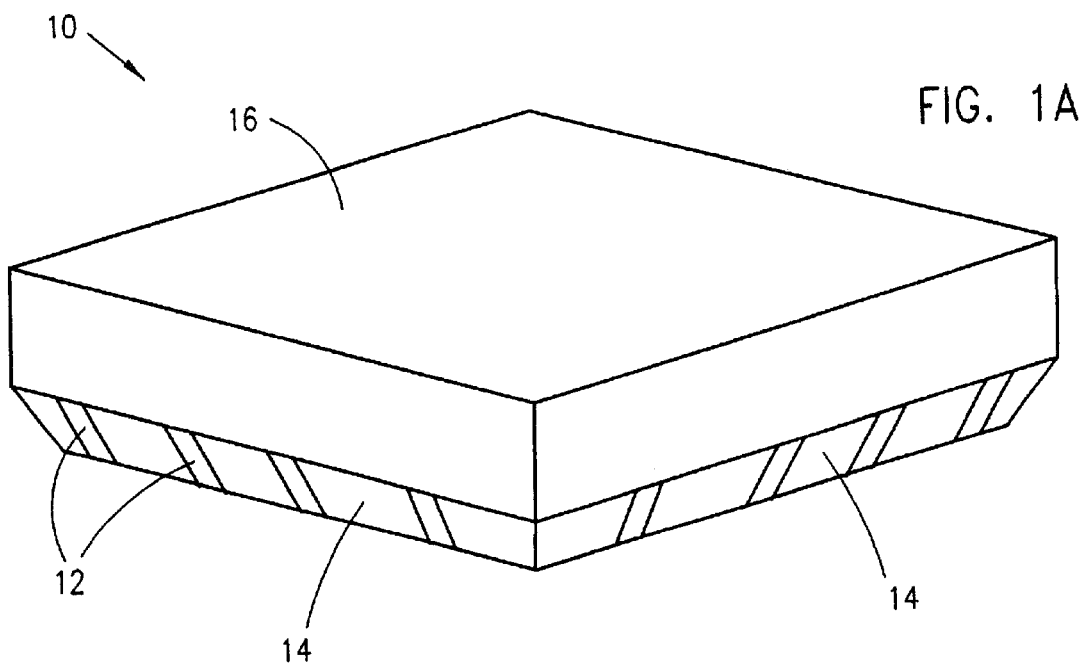
FIGS. 1A and 1B are respective top view and bottom view simplified pictorial illustrations of an integrally packaged optronic integrated circuit device constructed and operative in accordance with a preferred embodiment of the present invention.
Figure 1B:
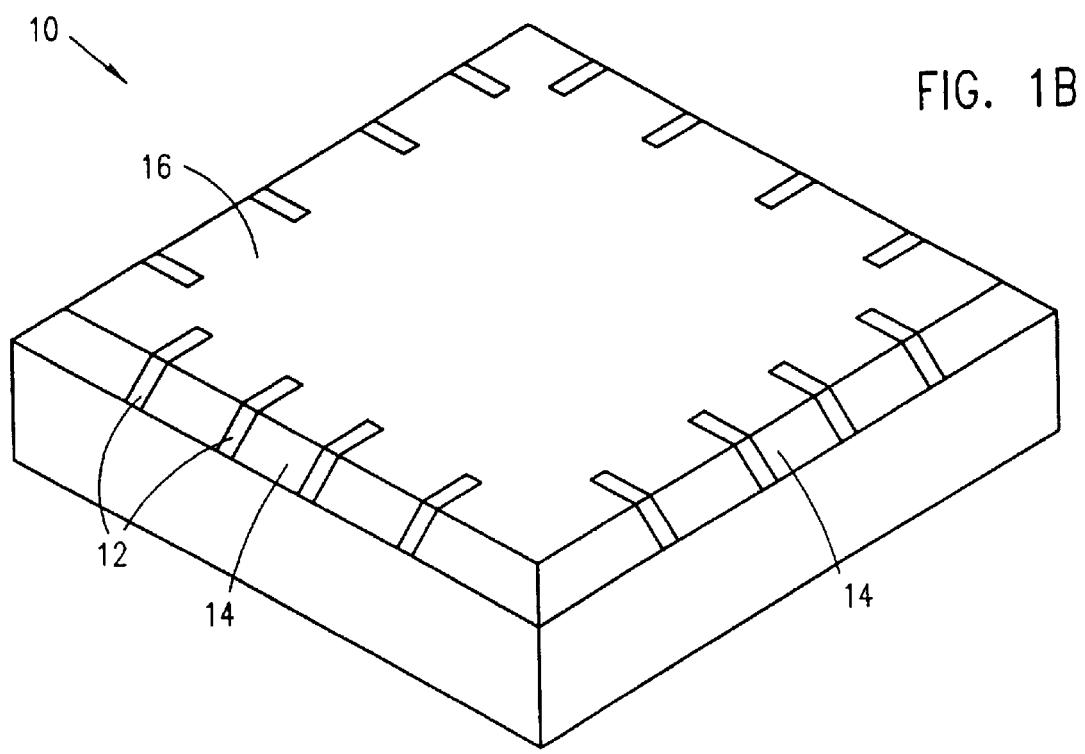

FIGS. 1A and 1B together illustrate a preferred embodiment of integrated circuit device constructed and operative in accordance with a preferred embodiment of the present invention. The integrated circuit device includes a relatively thin and compact, environmentally protected and mechanically strengthened integrated circuit package 10 having a multiplicity of electrical contacts 12 plated along the edge surfaces 14 thereof.

In accordance with a preferred embodiment of the invention, contacts 12 extend over edge surfaces onto the planar surfaces 16 of the package. This contact arrangement permits both flat surface mounting and edge mounting of package 10 onto a circuit board. It is noted that the integrated circuit package 10 may include one or more of the following elements (not shown): an integrally formed dichroic filter, color filter, antireflective coating, polarizer, optical grating, integrated wave guide and optical coupling bumps.

Figure 1C:
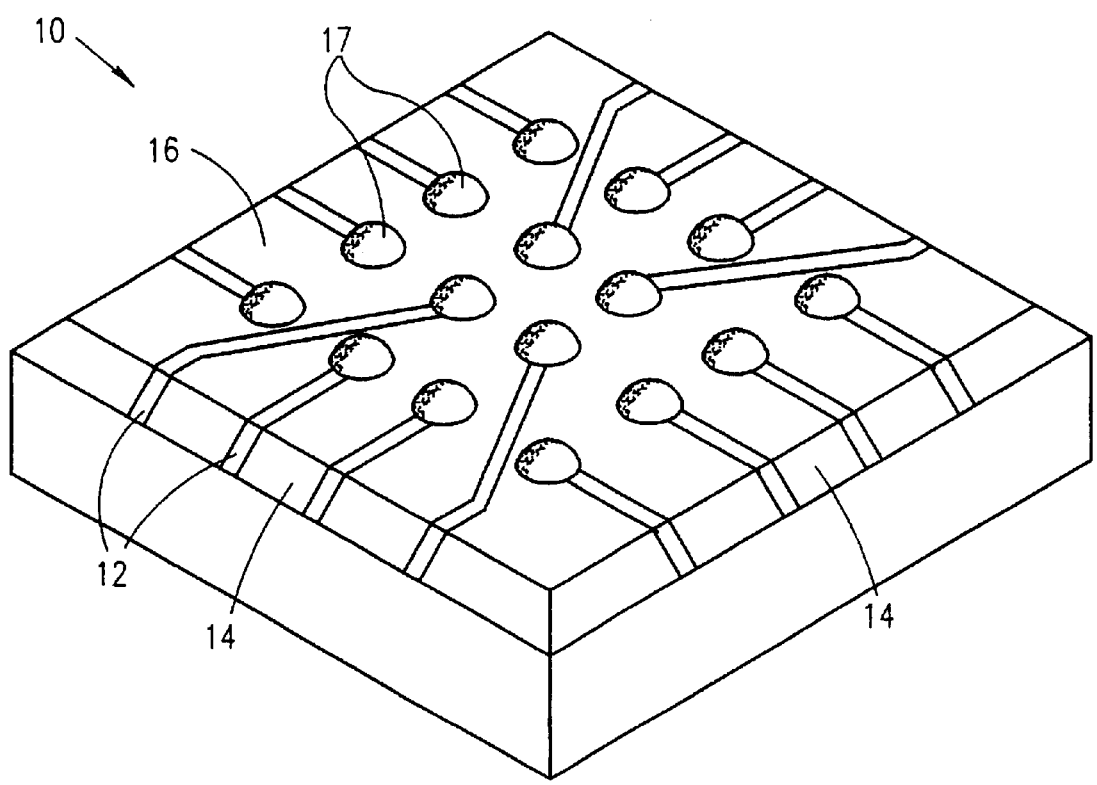
FIG. 1C is a bottom view simplified pictorial illustration of an integrally packaged optronic integrated circuit device of the type shown in FIGS. 1A and 1B, constructed and operative in accordance with another preferred embodiment of the present invention.

FIG. 1C illustrates an alternative embodiment of the present invention wherein solderable bumps 17 are provided at the ends of each contact 12. Preferably, the solderable bumps 17 are arranged in a predetermined array.

Figure 2:
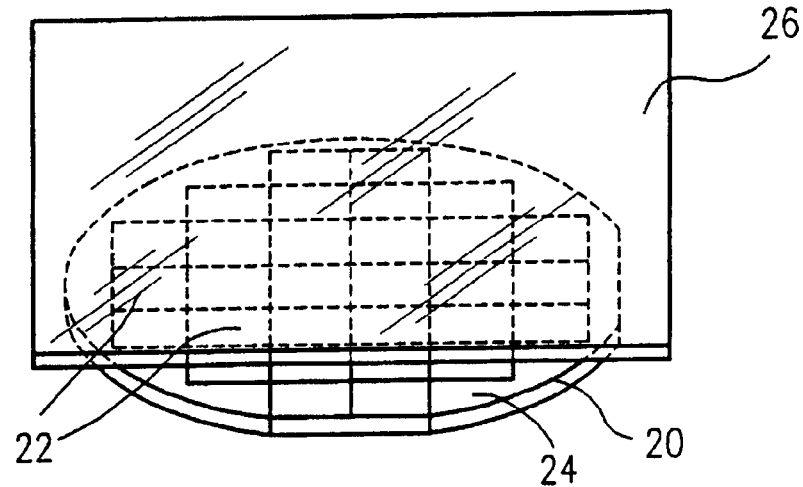
FIG. 2 is a simplified pictorial illustration of the attachment of a transparent protective packaging layer to a wafer containing a plurality of integrated circuit dies.
Figure 3:
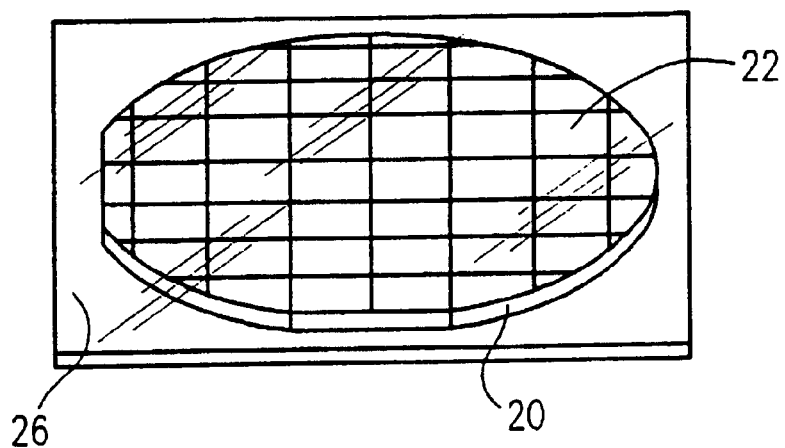
FIG. 3 is a simplified pictorial illustration of showing the individual dies on the wafer as seen through the transparent protective packaging layer attached thereto.
Figure 4A:
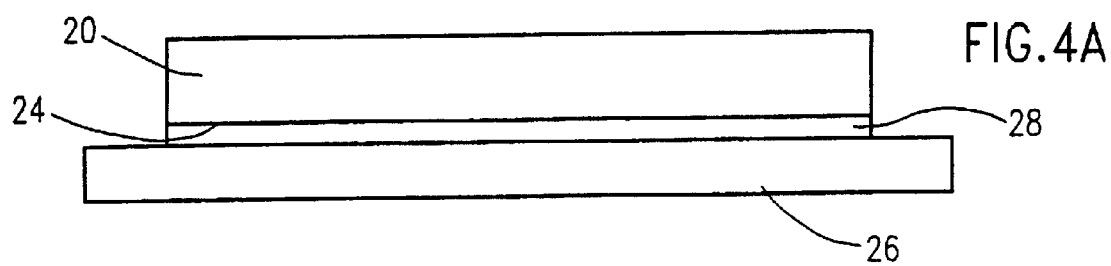
FIGS. 4A, 4B, 4C and 4D are sectional illustrations of various stages in the manufacture of integrally packaged optronic integrated circuit devices in accordance with a preferred embodiment of the present invention.

In accordance with a preferred embodiment of the present invention, and as illustrated in FIG. 2 and FIG. 4A, a complete silicon wafer 20 having a plurality of finished dies 22 formed thereon by conventional techniques, is bonded at its active surface 24 to a radiation transparent protective insulating cover plate 26 via a layer 28 of epoxy. The insulating cover plate 26 typically comprises glass, quartz, sapphire or any other suitable radiation transparent insulative substrate.

The cover plate 26 may be colored or tinted in order to operate as a spectral filter. Alternatively, a dichroic or colored spectral filter may be formed on at least one surface of the cover plate 26.

It is a particular feature of the present invention that cover plate 26 and epoxy layer 28 are preferably transparent to radiation in a spectral region useful for optronic applications.

It is appreciated that certain steps in the conventional fabrication of silicon wafer 20 may be eliminated when the wafer is used in accordance with the present invention. These steps include the provision of via openings above pads, wafer back grinding and wafer back metal coating.

The complete silicon wafer 20 may be formed with an integral color filter array by conventional lithography techniques at any suitable location therein. Prior to the bonding step of FIG. 4A, a filter may be formed and configured by conventional techniques over the cover plate 26, such that the filter plane lies between cover plate 26 and the epoxy layer 28.

Figure 4B:
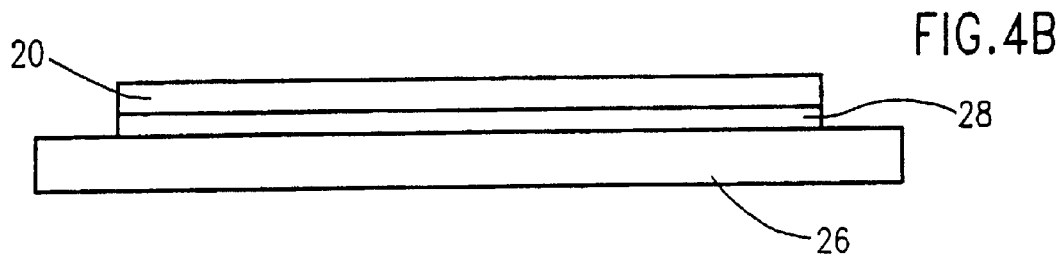

Following the bonding step described hereinabove, the silicon wafer is preferably ground down to a decreased thickness, typically 100 microns, as shown in FIG. 4B. This reduction in wafer thickness is enabled by the additional mechanical strength provided by the bonding thereof of the insulating cover plate 26.

Following the reduction in thickness of the wafer, which is optional, the wafer is etched, using a photolithography process, along its back surface along predetermined dice lines which separate the individual dies. Etched channels 30 are thus produced, which extend entirely through the thickness of the silicon substrate, typically 100 microns. The etched wafer is shown in FIG. 4C.

Figure 4C:
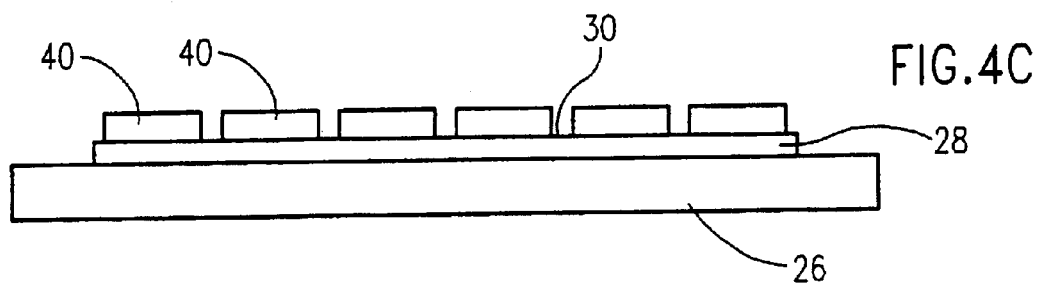

The aforementioned etching typically takes place in conventional silicon etching solution, such as a combination of 2.5% hydrofluoric acid, 50% nitric acid, 10% acetic acid and 37.5% water, so as to etch the silicon down to the field oxide layer, as shown in FIG. 4C.

The result of the silicon etching is a plurality of separated dies 40, each of which includes silicon of thickness about 100 microns.

Figure 4D:
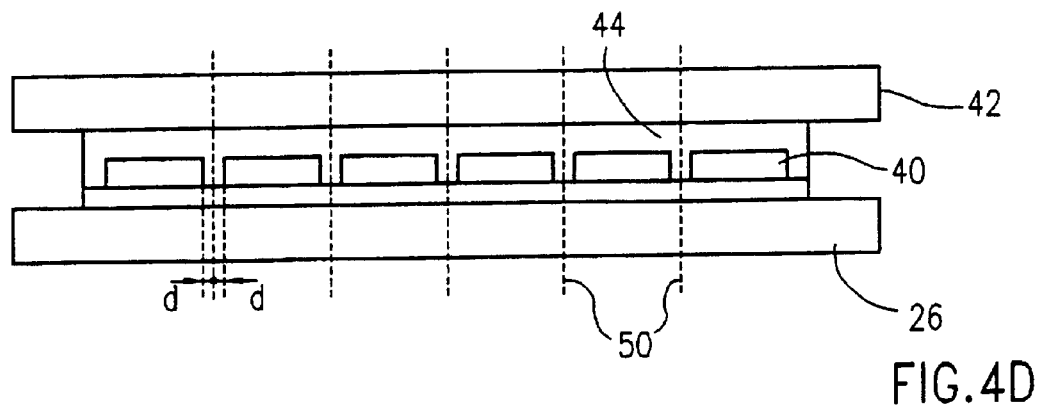

As seen in FIG. 4D, following the silicon etching, a second insulating packaging layer 42 is bonded over the dies 40 on the side thereof opposite to insulating packaging layer 26. A layer 44 of epoxy lies between the dies 40 and the layer 42 and epoxy also fills the interstices between dies 40. In certain applications, such as the embodiment of FIGS. 12A–12C, the packaging layer 42 and the epoxy layer 44 are both transparent.

The sandwich of the etched wafer 20 and the first and second insulating packaging layers 26 and 42 is then partially cut along lines 50, lying along the interstices between adjacent dies 40 to define notches along the outlines of a plurality of pre-packaged integrated circuits. It is a particular feature of the invention that lines 50 are selected such that the edges of the dies along the notches are distanced from the outer extent of the silicon 40 by at least a distance d, as shown in FIGS. 4D and 5, to which reference is now additionally made.

It is a particular feature of the present invention that partial cutting of the sandwich of FIG. 4D along lines 50 exposes edges of a multiplicity of pads 34 on the wafer 20, which pad edges, when so exposed, define contact surfaces 51 on dies 40.

Figure 5:
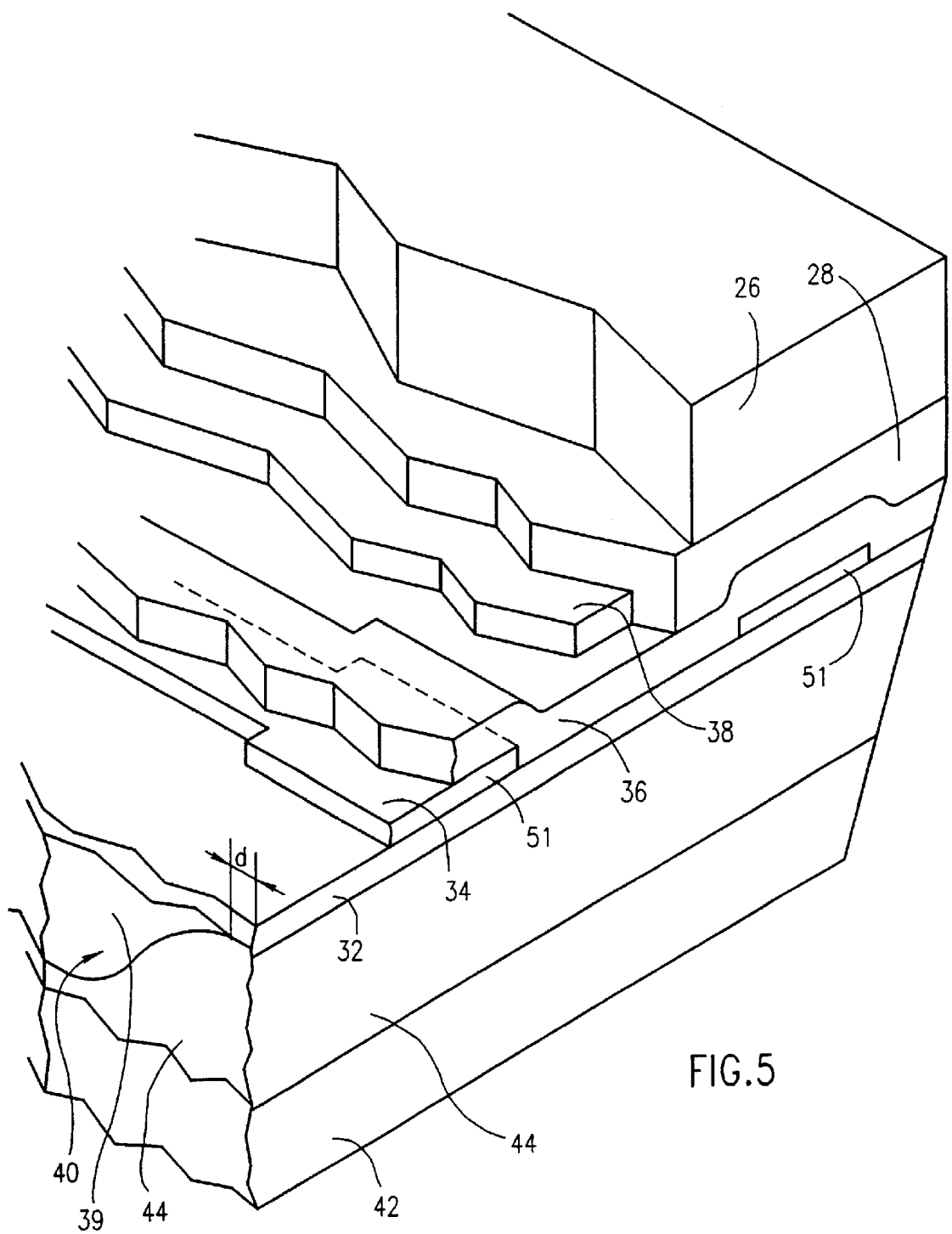
FIG. 5 is a partially cut away detailed pictorial illustration of n integrally packaged optronic integrated circuit vice produced from the wafer of FIG. 4D.

Referring now particularly to FIG. 5, at least one insulating layer, including the field oxide layer, is shown at reference numeral 32 and metal pads are shown at reference numeral 34. An over-metal insulating layer is shown at reference numeral 36. The color filter plane is shown at reference numeral 38.

Reference is now made to FIGS. 6, 7A, 7B, 8A and 8B, which illustrate further steps in the manufacture of integrated circuit devices in accordance with a preferred embodiment of the present invention.

Figure 6:
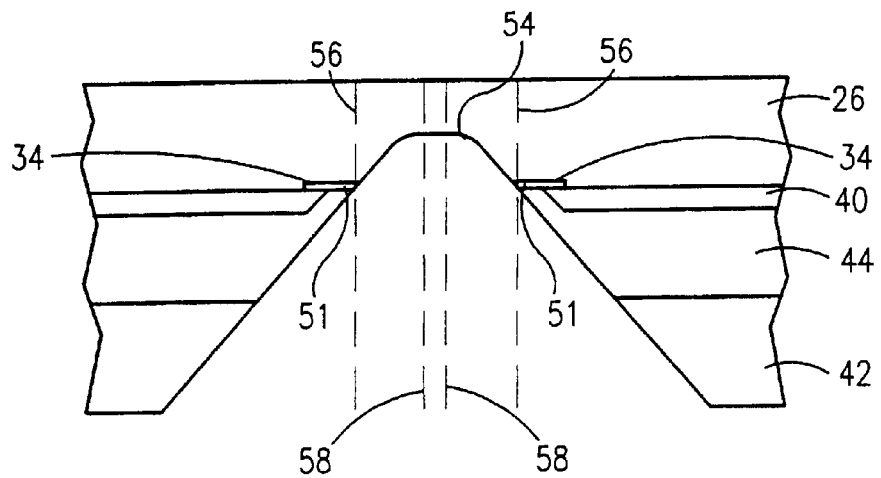
FIGS. 6 7A, 7B 8A and 8B are sectional illustrations of various stages in the manufacture of the integrally packaged optronic integrated circuit device shown in FIGS. 1A, 1B, 1C & 5.

FIG. 6 illustrates at reference numeral 54, a preferred cross sectional configuration of a notch produced by partially cutting as described hereinabove in connection with FIG. 5. Vertical lines 56 indicate the intersection of the notch 54 with the pads 34, defining exposed sectional pad surfaces 51. Vertical lines 58 indicate the location of a subsequent final cut which separates the dies into individual integrated circuits at a later stage.

Figure 7A:
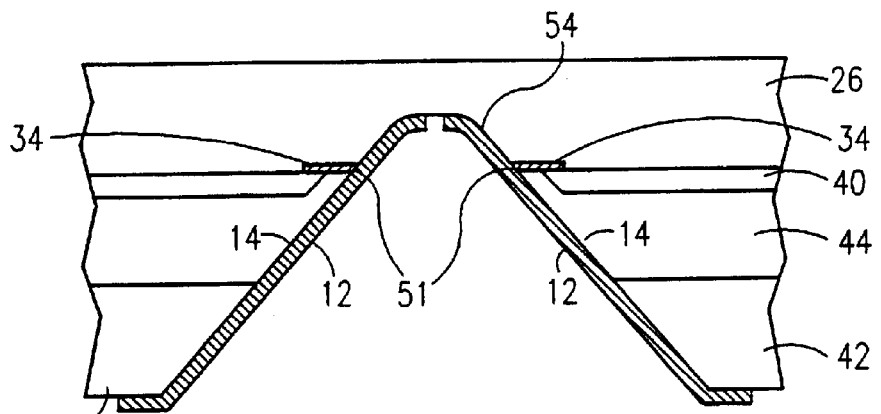
Figure 7B:
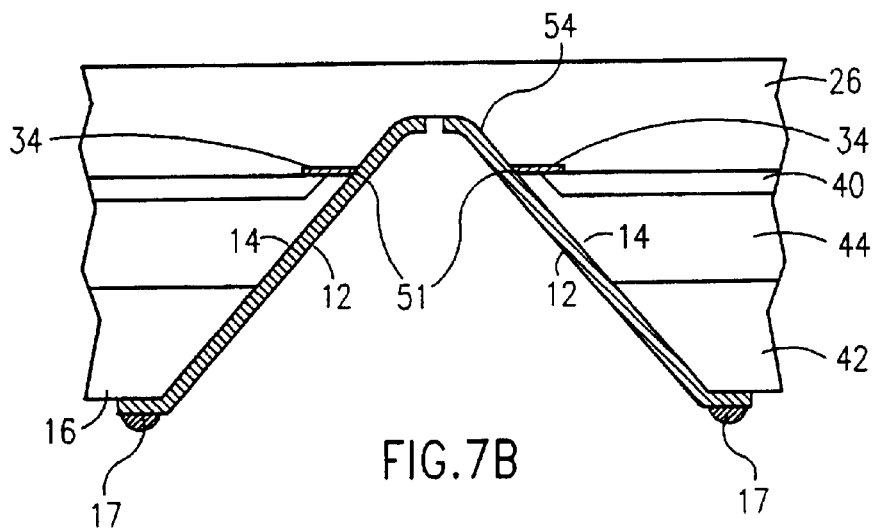

FIGS. 7A and 7B illustrate the formation of metal contacts 12 along the inclined edges 14 and part of the top surface 16. These contacts, which may be formed by any suitable metal deposition technique, are seen to extend inside notch 54, thus establishing electrical contact with surfaces 51 of pads 34. FIG. 7A shows a configuration corresponding to that of FIGS. 1A and 1B without solderable bumps, while FIG. 7B shows the provision of solderable bumps 17 on contacts 12, as illustrated in FIG. 1C.

It is a particular feature of the present invention that metal contacts are formed onto the dies in electrical contact with surfaces 51 of pads 34 without first separating the dies into individual chips.

Figure 8A:
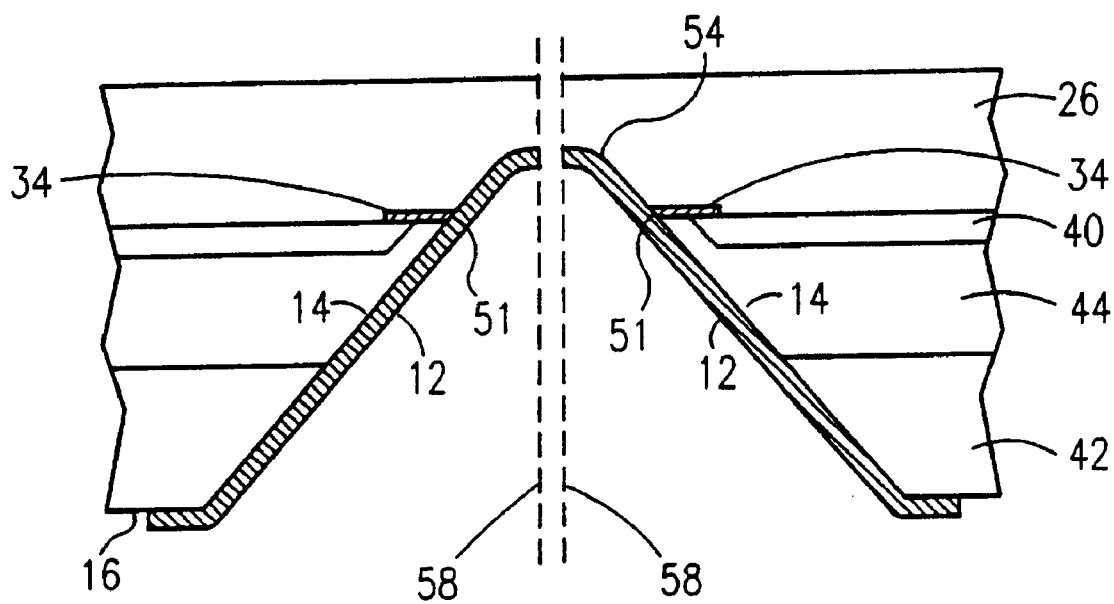
Figure 8B:
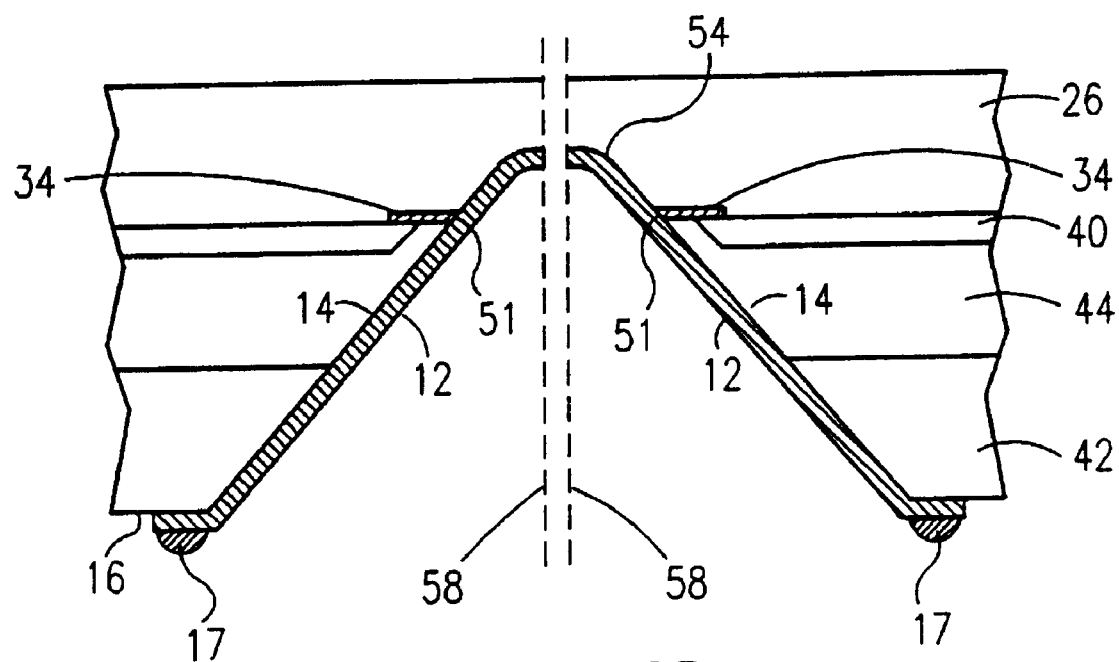

FIGS. 8A and 8B illustrate subsequent dicing of the individual dies on the wafer, subsequent to metal contact formation thereon, into individual pre-packaged integrated circuit devices. FIG. 8A shows a configuration corresponding to that of FIGS. 1A and 1B without solderable bumps, while FIG. 8B shows the provision of solderable bumps 17 on contacts 12, as illustrated in FIG. 1C.

Figure 10A:
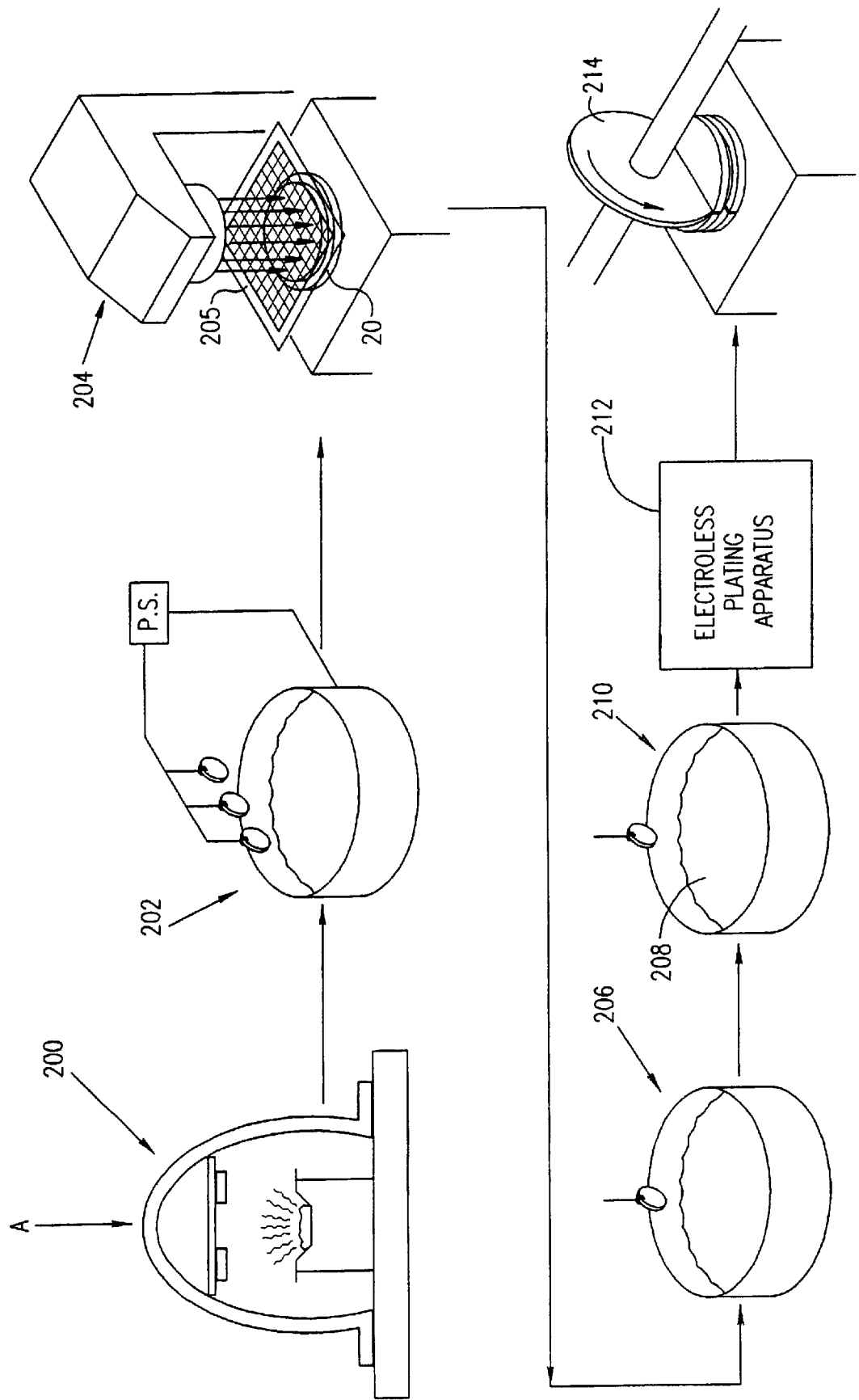
Figure 10B:
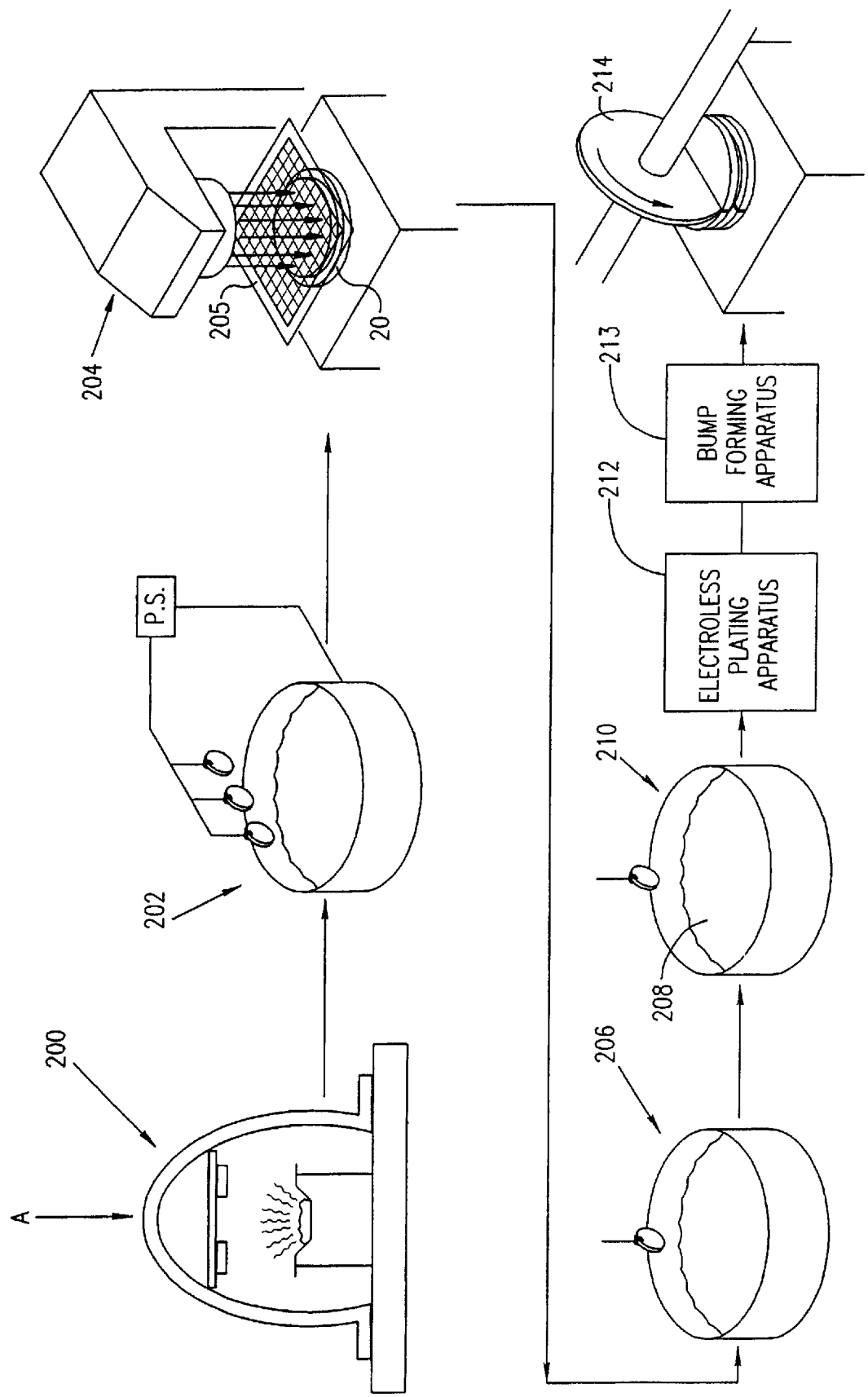

Reference is now made to FIGS. 9, 10A and 10B, which together illustrate apparatus for producing integrated circuit devices in accordance with a preferred embodiment of the present invention. A conventional wafer fabrication facility 180 provides complete wafers 20. Individual wafers 20 are bonded on their active surfaces to protective layers, such as glass layers 26, using epoxy 28, by bonding apparatus 182, preferably having facilities for rotation of the wafer 20, the layer 26 and the epoxy 28 so as to obtain even distribution of the epoxy.

The bonded wafer (FIG. 3) is thinned at its non-active surface as by grinding apparatus 184, such as Model 32BTGW using 12.5A abrasive, which is commercially available from Speedfam Machines Co. Ltd. of England.

The wafer is then-etched at its non-active surface, preferably by photolithography, such as by using conventional spin-coated photoresist, which is commercially available from Hoechst, under the brand designation AZ 4562.

The photoresist is preferably mask exposed by a suitable UV exposure system 185, such as a Karl Suss Model KSMA6, through a lithography mask 186 to define etched channels 30.

The photoresist is then developed in a development bath (not shown), baked and then etched in a silicon etch solution 190 located in a temperature controlled bath 188. Commercially available equipment for this purpose include a Chemkleen bath and an WHRV circulator both of which are manufactured by Wafab Inc. of the U.S.A. A suitable conventional silicon etching solution is Isoform Silicon etch, which is commercially available from Micro-Image Technology Ltd. of England. The wafer is conventionally rinsed after etching. The resulting etched wafer is shown in FIG. 4C.

Alternatively, the foregoing wet chemical etching step may be replaced by dry plasma etching.

The etched wafer is bonded on the non-active side to another protective layer 42 by bonding apparatus 192, which may be essentially the same as apparatus 182, to produce a doubly bonded wafer sandwich as shown in FIG. 4D.

Notching apparatus 194 partially cuts the bonded wafer sandwich of FIG. 4D to a configuration shown in FIG. 5.

The notched wafer is then subjected to anticorrosion treatment in a bath 196, containing a chromating solution 198, such as described in any of the following U.S. Pat. Nos. 2,507,956; 2,851,385 and 2,796,370, the disclosure of which is hereby incorporated by reference.

Conductive layer deposition apparatus 200, which operates by vacuum deposition techniques, such as a Model 903M sputtering machine manufactured by Material Research Corporation of the U.S.A., is employed to produce a conductive layer on one or more surfaces of each die of the wafer as shown in FIG. 7.

Configuration of contact strips, as shown in FIG. 7, is carried out preferably by using conventional electro-deposited photoresist, which is commercially available from DuPont under the brand name Primecoat or from Shipley, under the brand name Eagle. The photoresist is applied to the wafers in a photoresist bath assembly 202 which is commercially available from DuPont or Shipley.

The photoresist is preferably light configured by a UV exposure system 204, which may be identical to system 185, using a mask 205 to define suitable etching patterns. The photoresist is then developed in a development bath 206, and then etched in a metal etch solution 208 located in an etching bath 210, thus providing a conductor configuration such as that shown in FIGS. 1A and 1B.

The exposed conductive strips shown in FIG. 7 are then plated, preferably by electroless plating apparatus 212, which is commercially available from Okuno of Japan.

The wafer is then diced into individual prepackaged integrated circuit devices. Preferably the dicing blade 214 should be a diamond resinoid blade of thickness 4–12 mils. The resulting dies appear as illustrated generally in FIGS. 1A and 1B.

FIG. 10A shows apparatus for producing an integrated circuit configuration corresponding to that of FIGS. 1A and 1B without solderable bumps, while FIG. 10B shows apparatus for producing an integrated circuit configuration corresponding to that of FIG. 1C having solderable bumps. The embodiment of FIG. 10B is identical to that of FIG. 10A, apart from the additional provision of bump forming apparatus 213 downstream of the electroless plating apparatus 212.

Figure 11A:
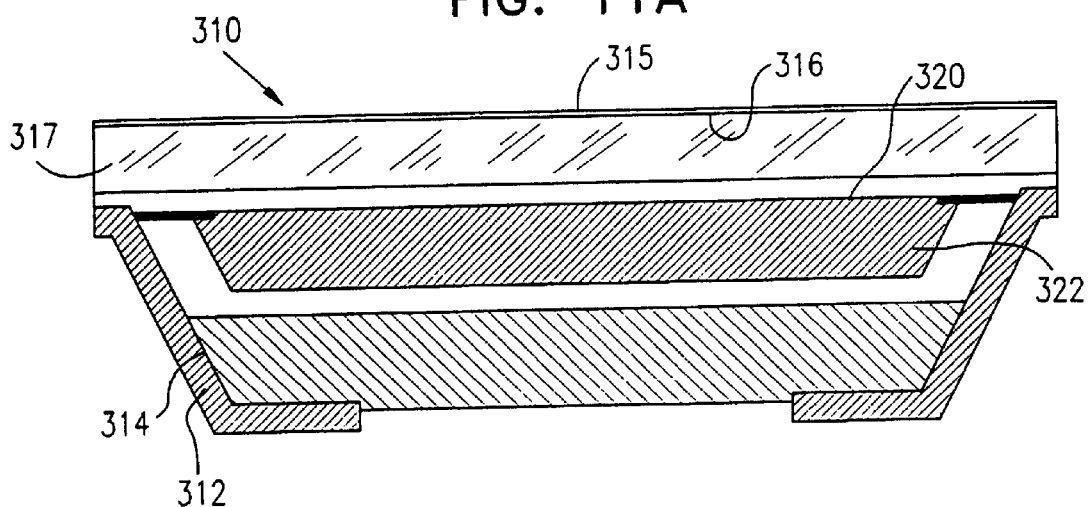

Reference is now made to FIGS. 11A–1E, which illustrate five alternative preferred embodiments of integrated circuit device constructed and operative in accordance with another preferred embodiment of the present invention and includes a relatively thin and compact, environmentally protected and mechanically strengthened integrated circuit package 310 having a multiplicity of electrical contacts 312 plated along the edge surfaces 314 thereof.

Figure 11B:
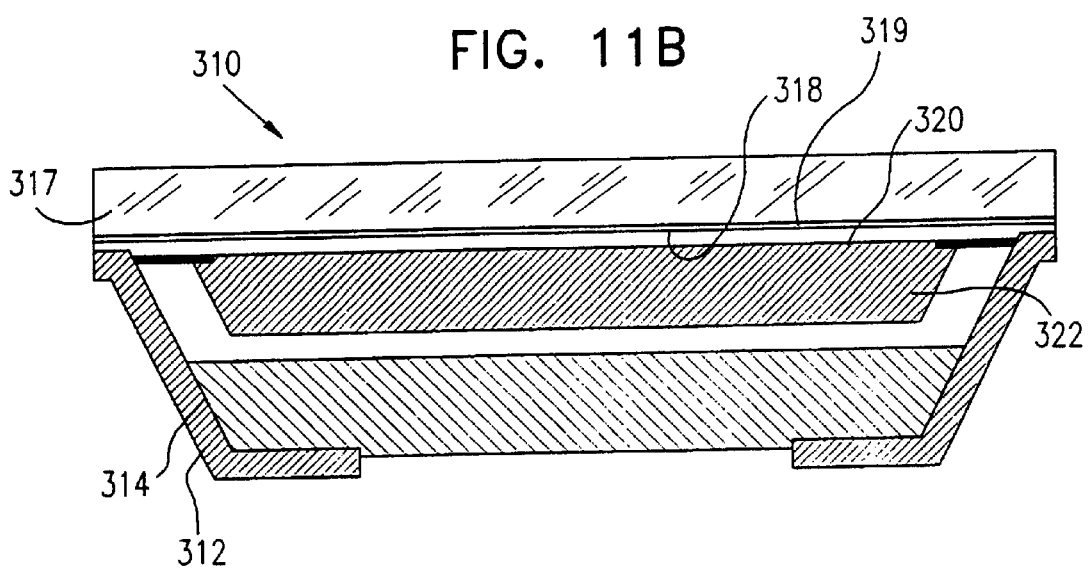
Figure 11C:
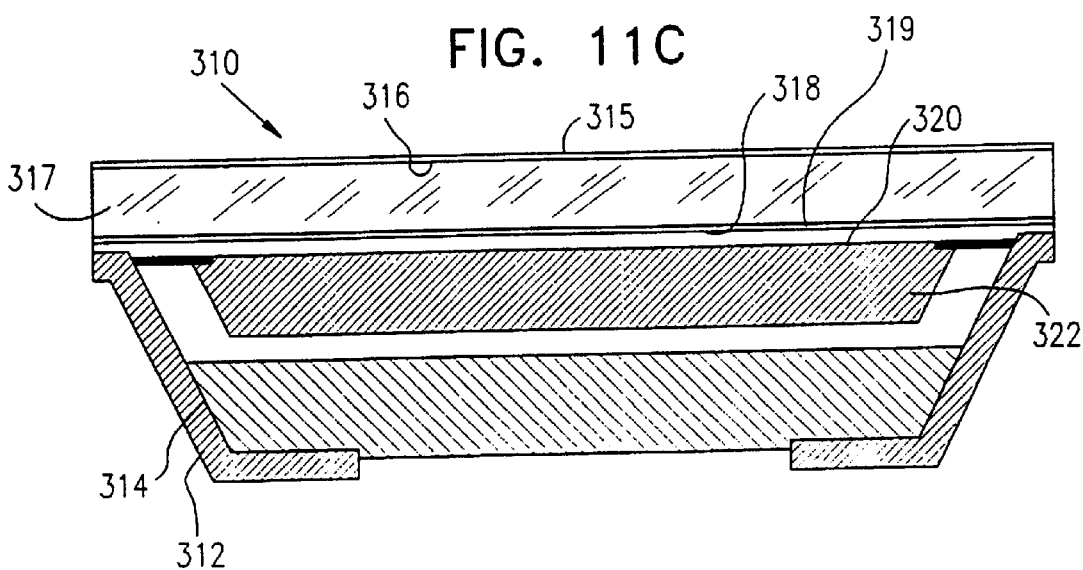

FIG. 11A shows a dichroic filter and/or antireflective coating 315 formed on an outer facing surface 316 of a transparent protective layer 317. FIG. 11B illustrates a coating 318, which may be identical to coating 315, which is formed on an inner facing surface 319 of transparent protective layer 317. FIG. 11C shows both coatings 315 and 318 on respective surfaces 316 and 319 of transparent protective layer 317. Optronic components are formed on a surface 320 of a silicon substrate 322 of conventional thickness, typically 100 microns. Surface 320 faces transparent protective layer 317.

FIG. 11D shows an absorption filter 323 formed on outer facing surface 316 of transparent protective layer 317. FIG. 11E shows an absorption filter 323, having formed thereon an anti-reflective coating. 324, formed on outer facing surface 316 of transparent protective layer 317.

Figure 12A:
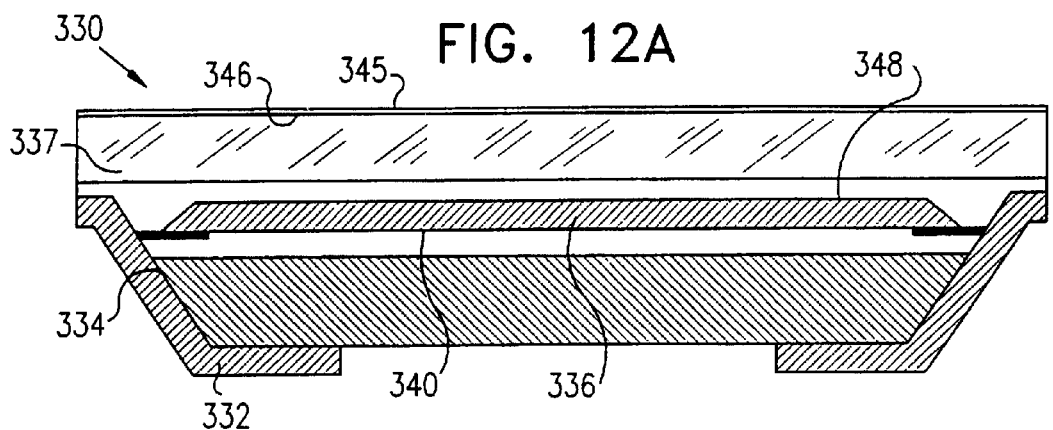
FIGS. 12A, 12B and 12C are simplified pictorial illustrations of three alternative embodiments of an integrally packaged optronic integrated circuit device which is designed for back illumination.
Figure 12B:
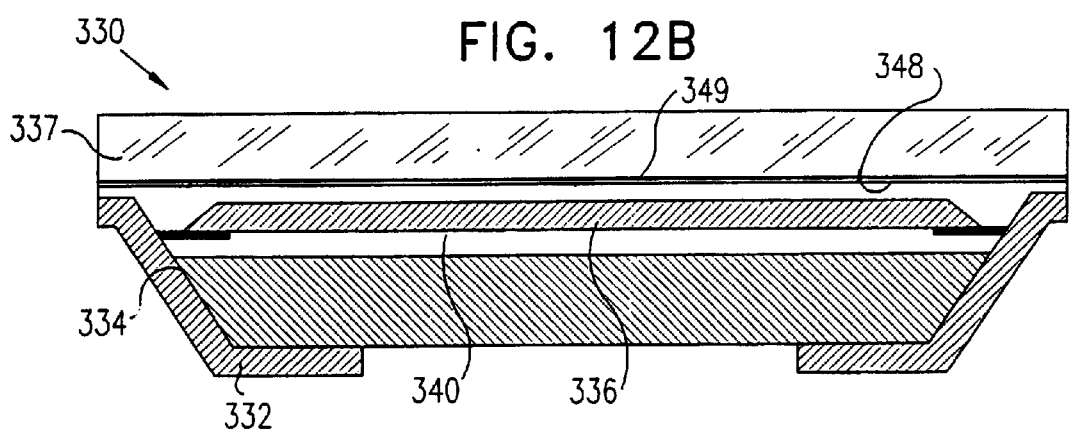
Figure 12C:
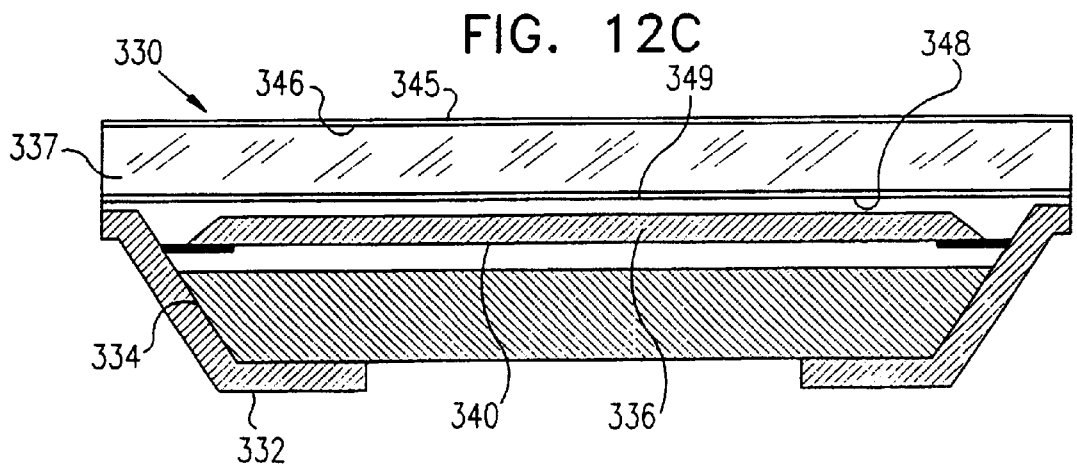

Reference is now made to FIGS. 12A–12C, which illustrate three alternative preferred embodiments of integrated circuit device which include a relatively thin and compact, environmentally protected and mechanically strengthened integrated circuit package 330 having a multiplicity of electrical contacts 332 plated along the edge surfaces 334 thereof.

In contrast to the embodiments of FIGS. 11A–11E, the integrated circuit devices of FIGS. 12A–12C are designed for back illumination and therefore employ a thinned silicon substrate 336, typically having a thickness of 12–15 microns.

Whereas in the embodiment of FIGS. 11A–11E, the optronic components are formed on a surface 320 which faces a transparent protective layer 317, in the embodiment of FIGS. 12A–12B, the components may be formed on a surface 340 of substrate 336, which surface 340 faces away from the corresponding transparent protective layer 337. The extreme thickness of the substrate 336 in the embodiments of FIGS. 12A–12C enables the optronic components on surface 340 to be exposed to light impinging via transparent protective layer 337 by back exposure.

It is appreciated that silicon is transparent to certain radiation spectra, such as IR radiation. When an IR responsive device is provided, the embodiment of FIGS. 12A–12C can be constructed without a thinned silicon substrate.

FIG. 12A shows a dichroic filter and/or antireflective coating 345 formed on an outer facing surface 346 of the transparent protective layer 337. FIG. 12B illustrates a coating 348, which may be identical to coating 345, which is formed on an inner facing surface 349 of transparent protective layer 337. FIG. 12C shows both coatings 345 and 348 on respective surfaces 346 and 349 of transparent protective layer 337.

The modifications shown in FIGS. 11D and 11E may also be embodied in the configuration of FIGS. 12A–12C.

Figure 13A:
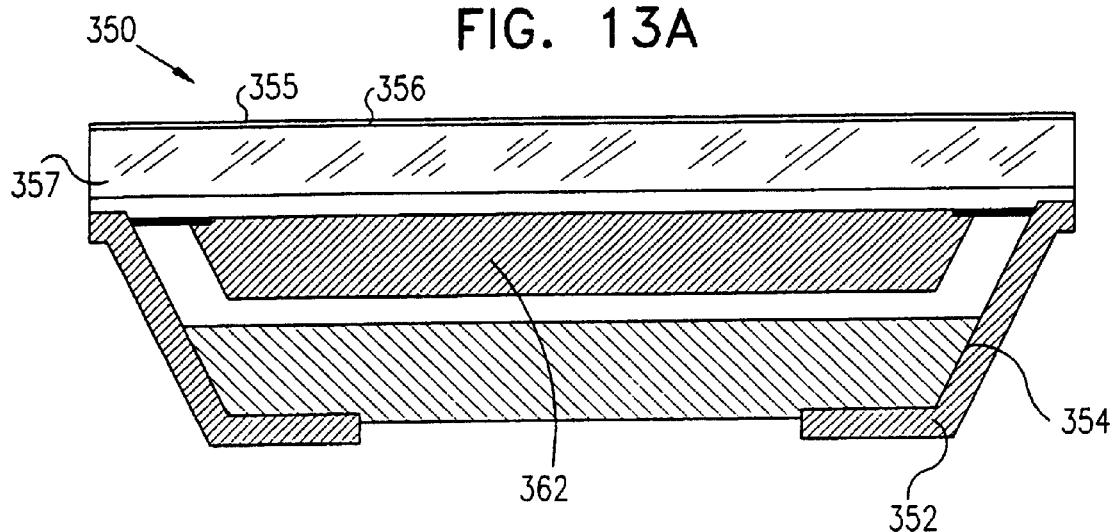
FIGS. 13A 13B and 13C are simplified pictorial illustrations of three alternative embodiments of an integrally packaged optronic integrated circuit device constructed and operative in accordance with still another preferred embodiment of the present invention wherein color array filters are integrated with the integrally packaged optronic integrated circuit device.
Figure 13B:
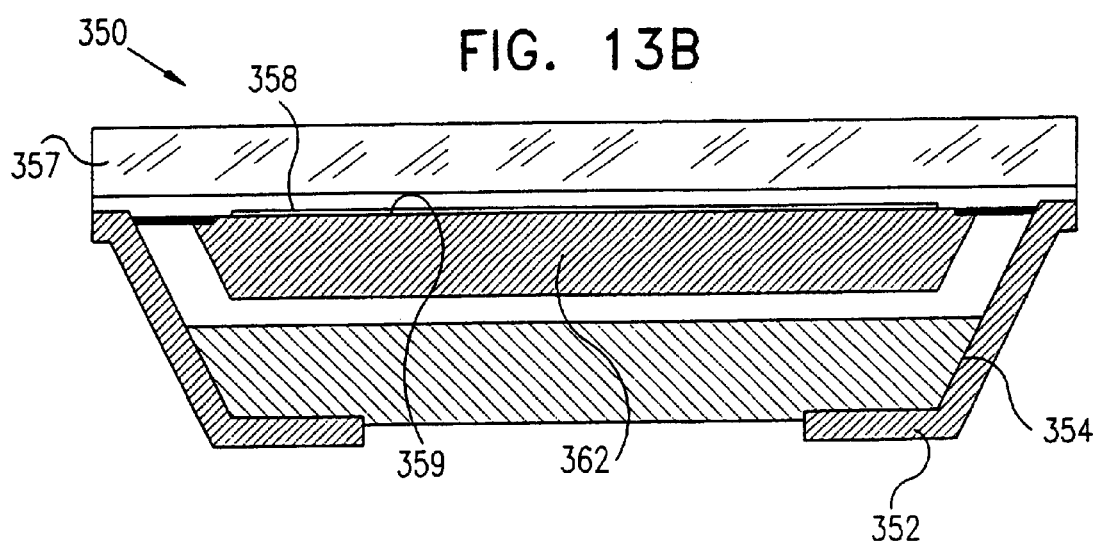
Figure 13C:
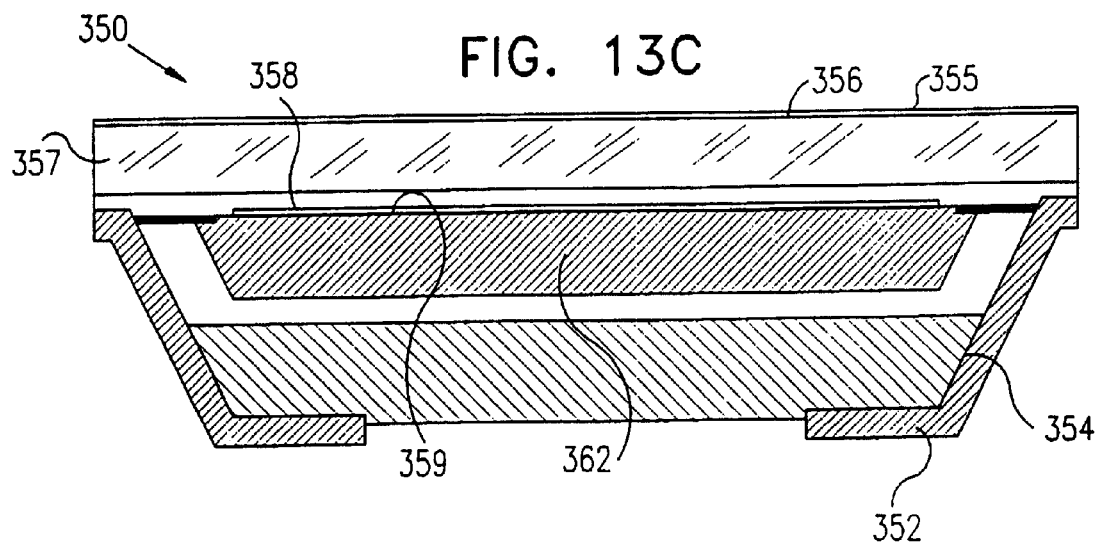

Reference is now made to FIGS. 13A, 13B and 13C, which illustrate three alternative preferred embodiments of integrated circuit device constructed and operative in accordance with another preferred embodiment of the present invention and includes a relatively thin and compact, environmentally protected and mechanically strengthened integrated circuit package 350 having a multiplicity of electrical contacts 352 plated along the edge surfaces 354 thereof.

FIG. 13A shows a color filter, such as an RGB or masking filter, 355 formed on an outer facing surface 356 of a transparent protective layer 357. FIG. 13B illustrates a filter 358, which may be identical to filter 355, which is formed on an outer facing surface 359 of a silicon substrate 362. FIG. 13C shows both filters 355 and 358 on respective surfaces 356 and 359.

It is appreciated that filter 356 may alternatively be located on an inner facing surface of transparent protective layer 357.

Reference is now made to FIGS. 14A, 14B, 14C and 14D, which illustrate four alternative embodiments of an integrally packaged optronic integrated circuit device constructed and operative in accordance with another preferred embodiment of the present invention having lenses integrally formed on a transparent protective surface thereof.

Figure 14A:
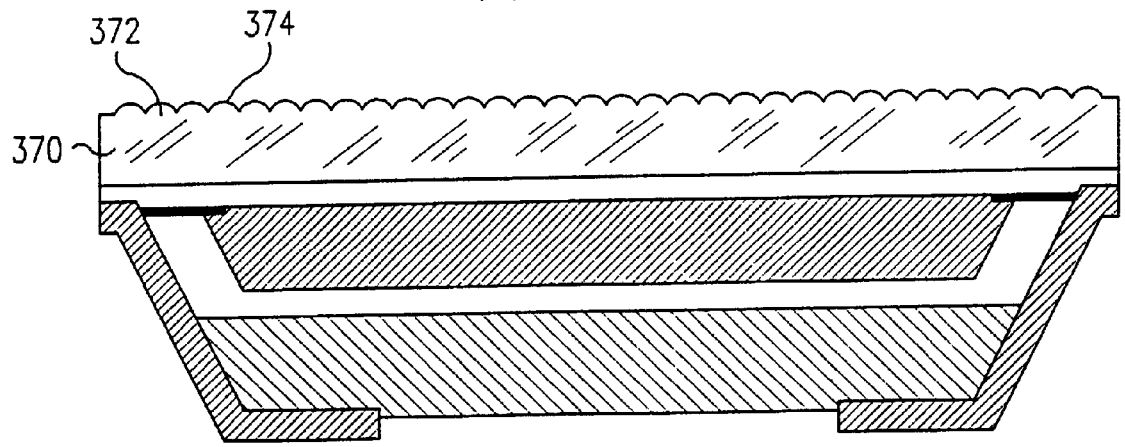
FIGS. 14A, 14B, 14C and 14D are simplified pictorial illustrations of four alternative embodiments of an integrally packaged optronic integrated circuit device constructed and operative in accordance with another preferred embodiment of the present invention having lenses integrally formed on a transparent protective surface thereof.

The embodiment of FIG. 14A may be identical to that of FIG. 11A without the coating and is further distinguished therefrom in that it has a transparent protective layer 370 which is formed with an array of microlenses 372 on an outer facing surface 374 thereof.

Figure 14B:
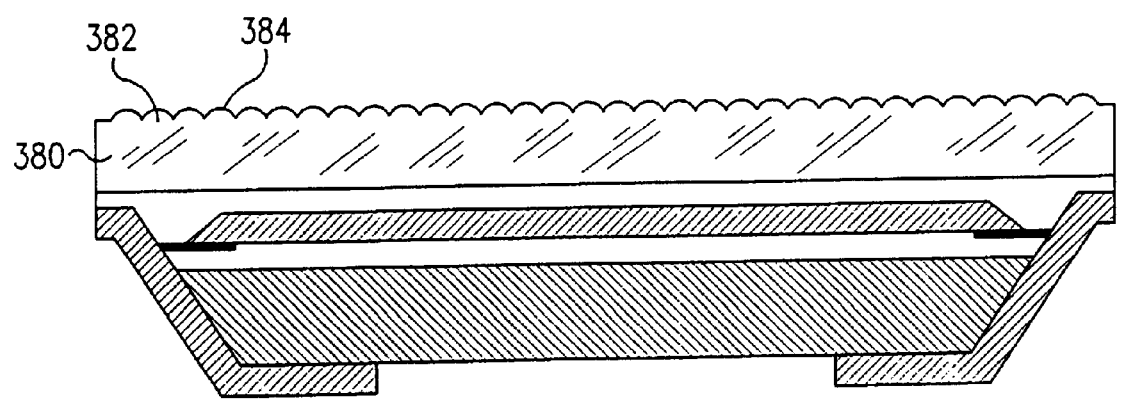

The embodiment of FIG. 14B may be identical to that of FIG. 12A without the coating and is further distinguished therefrom in that it has a transparent protective layer 380 which is formed with an array of microlenses 382 on an outer facing surface 384 thereof.

In the illustrated embodiment of FIGS. 14A and 14B, the microlenses 372 and 382 respectively are formed of the same material as than of transparent protective layers 370 and 380 respectively. Alternatively, microlenses 372 and 382 may be formed of a material different from that of respective transparent protective layers 370 and 380.

Figure 14C:
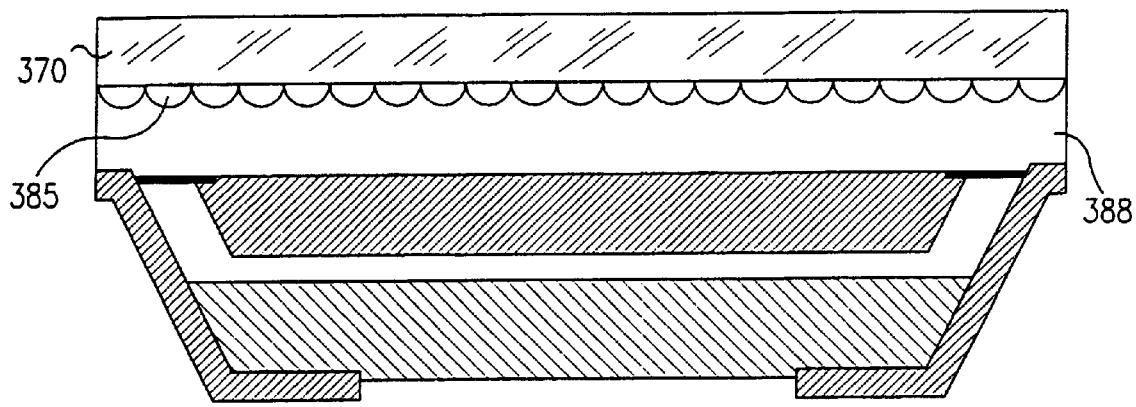

The embodiment of FIG. 14C corresponds to that of FIG. 14A. However in the embodiment of FIG. 14C, an array of microlenses 385 is formed on an inner facing surface of transparent protective layer 370. In the illustrated embodiment of FIG. 14C, the microlenses 385 are formed of a different material than of transparent protective layer 370. Alternatively, microlenses 385 may be formed of the same material as that of transparent protective layer 370.

Figure 14D:
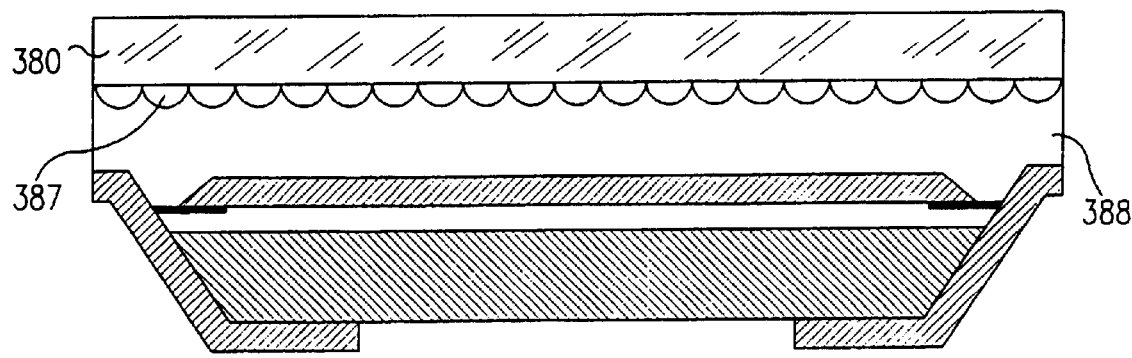

The embodiment of FIG. 14D corresponds to that of FIG. 14B. However in the embodiment of FIG. 14D, similarly to the embodiment of FIG. 14C, an array of microlenses 387 is formed on an inner facing surface of transparent protective layer 380. In the illustrated embodiment of FIG. 14D, the microlenses 387 are formed of a different material than of transparent protective layer 380. Alternatively, microlenses 387 may be formed of the same material as that of transparent protective layer 380.

In the embodiments of FIGS. 14C and 14D, the index of refraction of the microlenses 385 and 387 respectively must exceed that of an epoxy layer 388 underlying them.

Figure 15A:
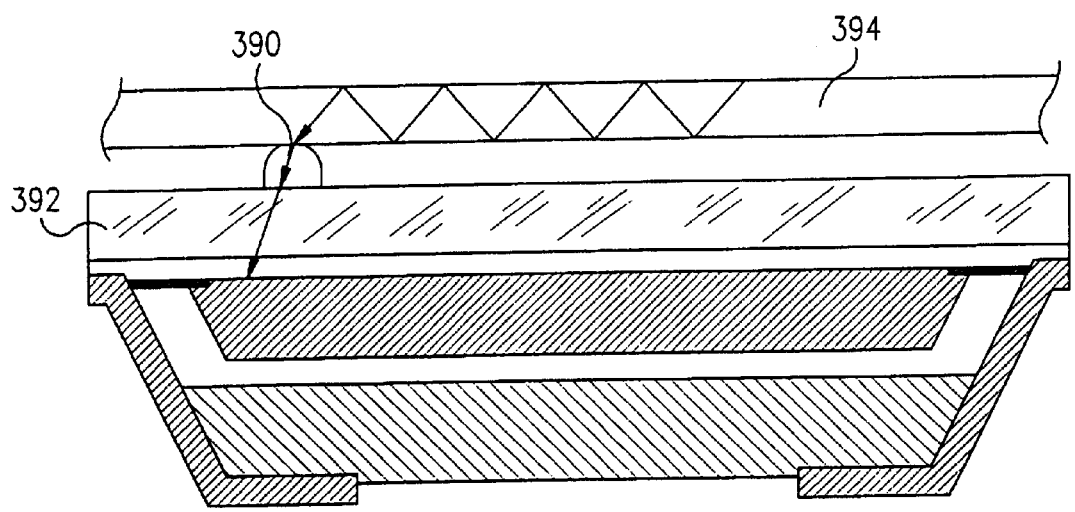
Figure 15B:
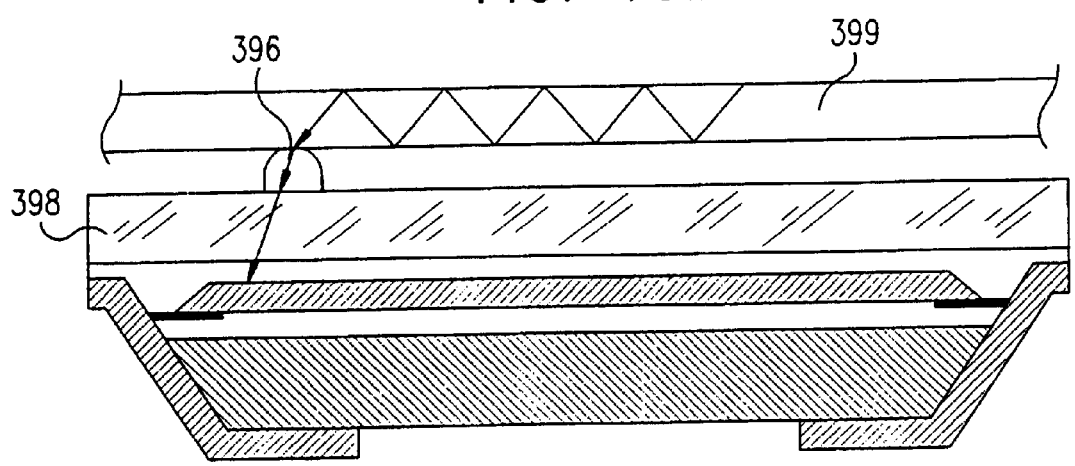

Reference is now made to FIGS. 15A and 15B, which are simplified pictorial illustrations of two alternative embodiments of an integrally packaged optronic integrated circuit device constructed and operative in accordance with another preferred embodiment of the present invention having light coupling bumps integrally formed on a transparent protective surface thereof.

The embodiment of FIG. 15A may be identical to that of FIG. 11A without the coating and is further distinguished therefrom in that it has a light coupling bump 390 formed on a transparent protective layer 392. A waveguide 394 is shown optically coupled to the transparent protective layer 392 via bump 390. Preferably the bump 390 is formed of a transparent organic material which is somewhat compliant such that mechanical pressure produces a slight deformation thereof and enables an evanescent light wave to pass through an interface defined therewith.

The embodiment of FIG. 15B may be identical to that of FIG. 12A without the coating and is further distinguished therefrom in that it has a light coupling bump 396 formed on a transparent protective layer 398. A waveguide 399 is shown optically coupled to the transparent protective layer 398 via bump 396.

Figure 16A:
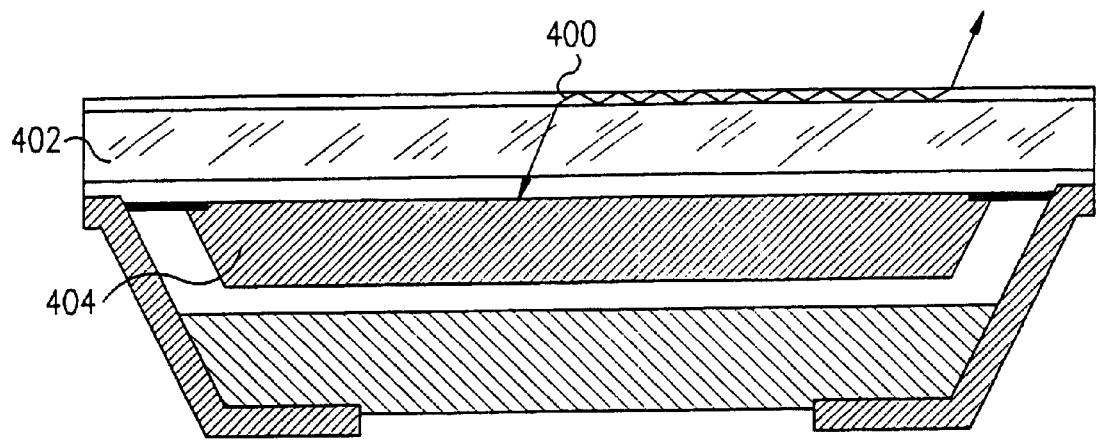
FIGS. 16A and 16B are simplified pictorial illustrations of two alternative embodiments of an integrally packaged optronic integrated circuit device constructed and operative in accordance with yet another preferred embodiment of the present invention having a waveguide and other optical components integrally formed on a transparent protective surface thereof.
Figure 16B:
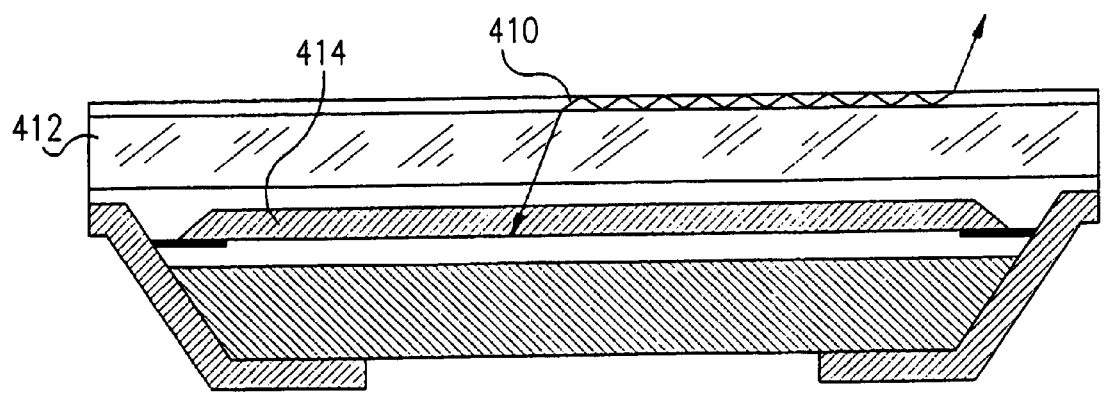

Reference is now made to FIGS. 16A and 16B which are simplified pictorial illustrations of two alternative embodiments of an integrally packaged optronic integrated circuit device constructed and operative in accordance with yet another preferred embodiment of the present invention having a waveguide and other optical components integrally formed on a transparent protective surface thereof.

The embodiment of FIG. 16A may be identical to that of FIG. 11A without the coating and is further distinguished therefrom in that it has a wave guide 400 and possibly other optical elements (not shown) formed on a transparent protective layer 402, as by conventional integrated optics techniques. This arrangement enables optical communication between an optronic component formed on a silicon substrate 404 via the transparent protective layer 402 and the wave guide 400.

The embodiment of FIG. 16B may be identical to that of FIG. 12A without the coating and is further distinguished therefrom in that it has a wave guide 410 and possibly other optical elements (not shown) formed on a transparent protective layer 412, as by conventional integrated optics techniques. This arrangement enables optical communication between an optronic component formed on a silicon substrate 414 via the transparent protective layer 412 and the wave.guide 410.

Figure 17A:
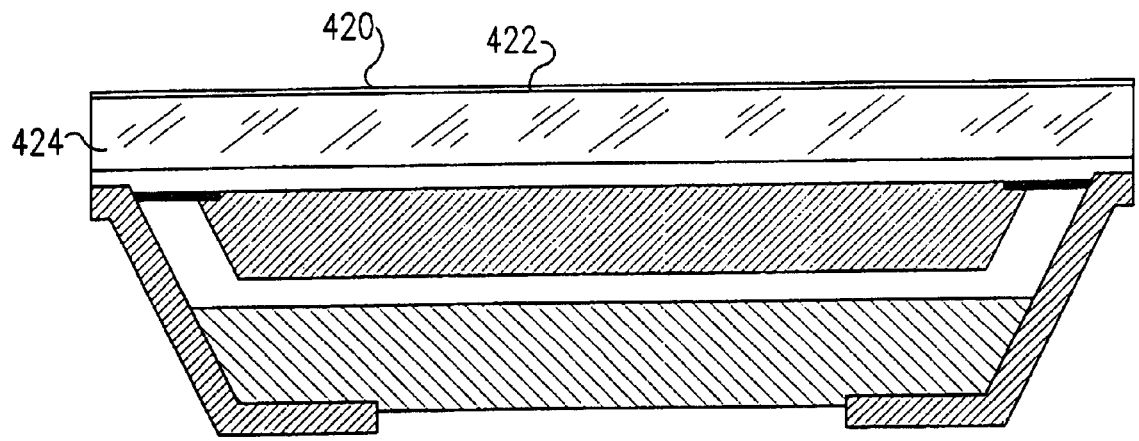
FIGS. 17A and 17B are simplified pictorial illustrations of two alternative embodiments of an integrally packaged optronic integrated circuit device constructed and operative in accordance with still another preferred embodiment of the present invention wherein a polarizer is integrated with the integrally packaged optronic integrated circuit device.
Figure 17B:
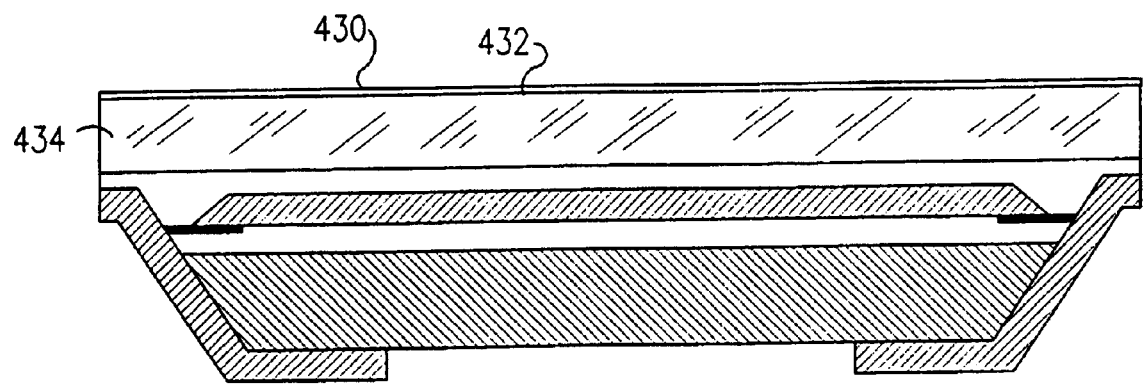

Reference is now made to FIGS. 17A and 17B, which are simplified pictorial illustrations of two alternative embodiments of an integrally packaged optronic integrated circuit device constructed and operative in accordance with still another preferred embodiment of the present invention wherein a polarizer is integrated with the integrally packaged optronic integrated circuit device.

The embodiment of FIG. 17A may be identical to that of FIG. 11A without the coating and is further distinguished therefrom in that it has a polarizer 420 which is on an outer facing surface 422 of a transparent protective layer 424.

The embodiment of FIG. 17B may be identical to that of FIG. 12A without the coating and is further distinguished therefrom in that it has a polarizer 430 which is on an outer facing surface 432 of a transparent protective layer 434.

Figure 18A:
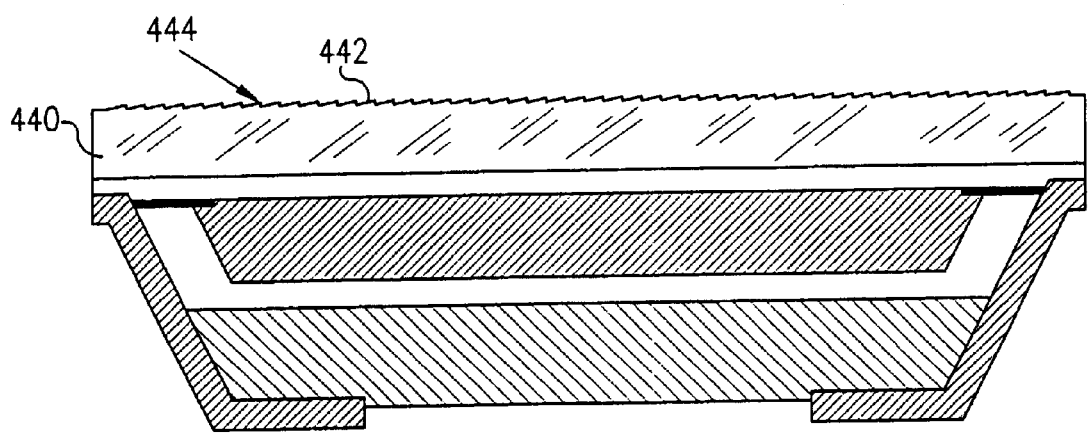
FIGS. 18A and 18B are simplified pictorial illustrations of two alternative embodiments of an integrally packaged optronic integrated circuit device constructed and operative in accordance with still another preferred embodiment of the present invention wherein an optical grating is integrated with the integrally packaged optronic integrated circuit device.
Figure 18B:
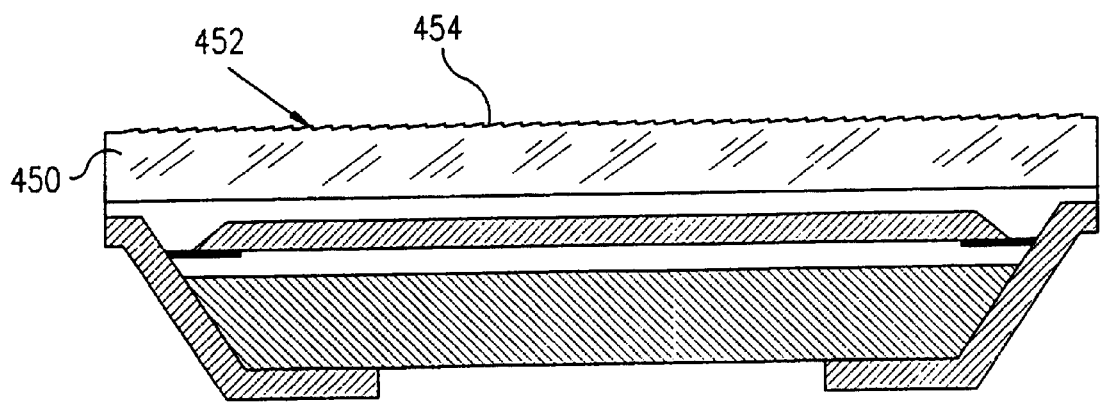

Reference is now made to FIGS. 18A and 18B, which are simplified pictorial illustrations of two alternative embodiments of an integrally packaged optronic integrated circuit device constructed and operative in accordance with still another preferred embodiment of the present invention wherein an optical grating is integrated with the integrally packaged optronic integrated circuit device.

The embodiment of FIG. 18A may be identical to that of FIG. 11A without the coating and is further distinguished therefrom in that it has a transparent protective layer 440 which is formed with an optical grating 442 on an outer facing surface 444 thereof.

The embodiment of FIG. 18B may be identical to that of FIG. 12A without the coating and is further distinguished therefrom in that it has a transparent protective layer 450 which is formed with an optical grating 452 on an outer facing surface 454 thereof.

Figure 19A:
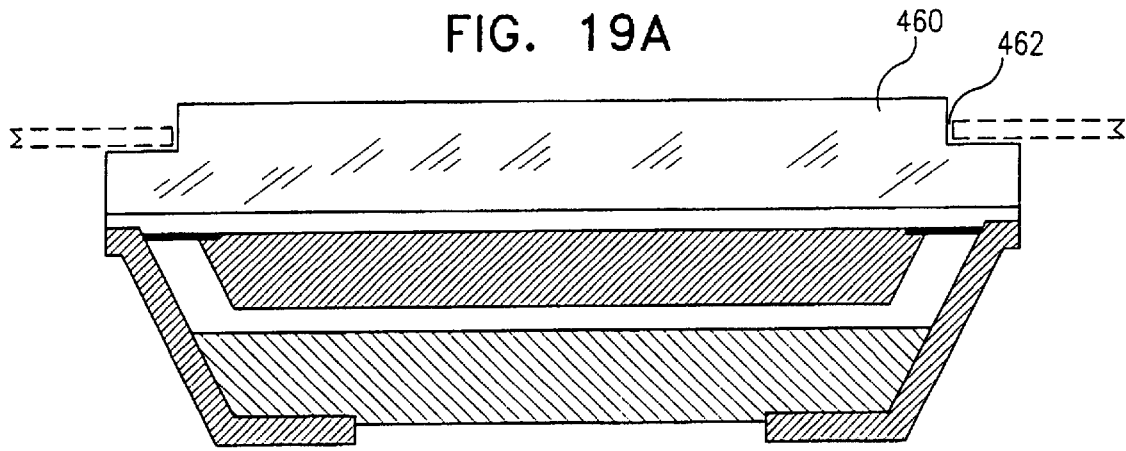
FIGS. 19A and 19B are simplified pictorial illustrations of two alternative embodiments of an integrally packaged optronic integrated circuit device constructed and operative in accordance with yet another preferred embodiment of the present invention wherein the package is formed with a desired geometrical configuration.
Figure 19B:
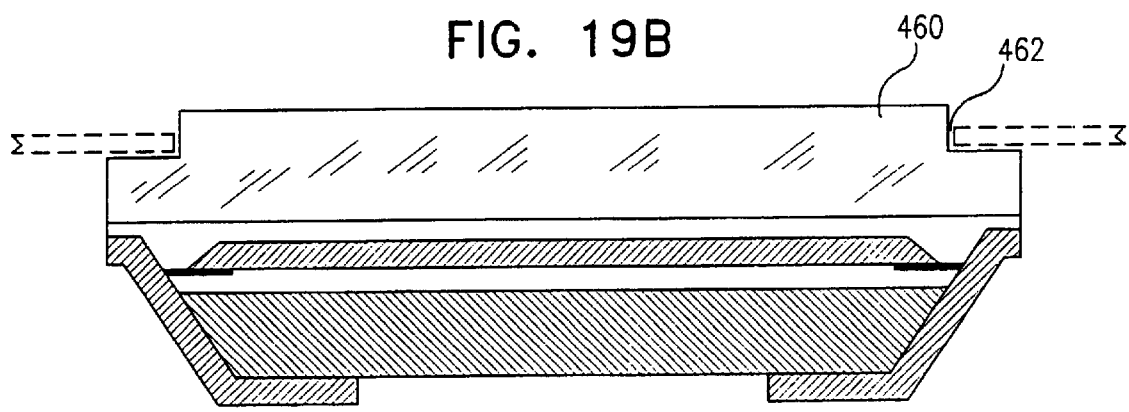

Reference is now made to FIGS. 19A and 19B which may be generally similar in all relevant respects to respective FIGS. 11A and 12A respectively. The embodiment of FIGS. 19A and 19B is characterized in that a transparent protective layer 460 is provided with a particular edge configuration, preferably to enable it to be located in an aperture. In FIGS. 19A and 19B, the transparent protective layer 460 is shown with a peripheral edge defining a step 462. It is appreciated that any other suitable configuration may also be provided for the transparent protective layer 460.

Figure 20A:
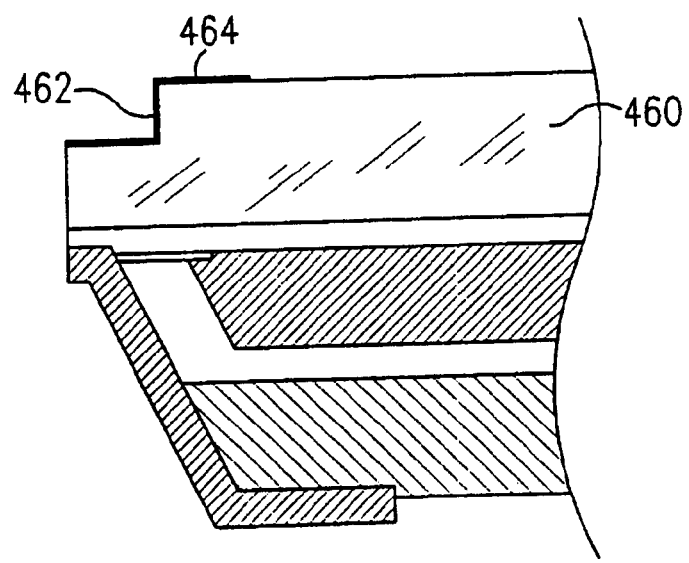
FIGS. 20A and 20B are simplified pictorial illustrations of two alternative embodiments of an integrally packaged optronic integrated circuit device constructed and operative in accordance with yet another preferred embodiment of the present invention wherein edges of the package are coated with an opaque coating.
Figure 20B:
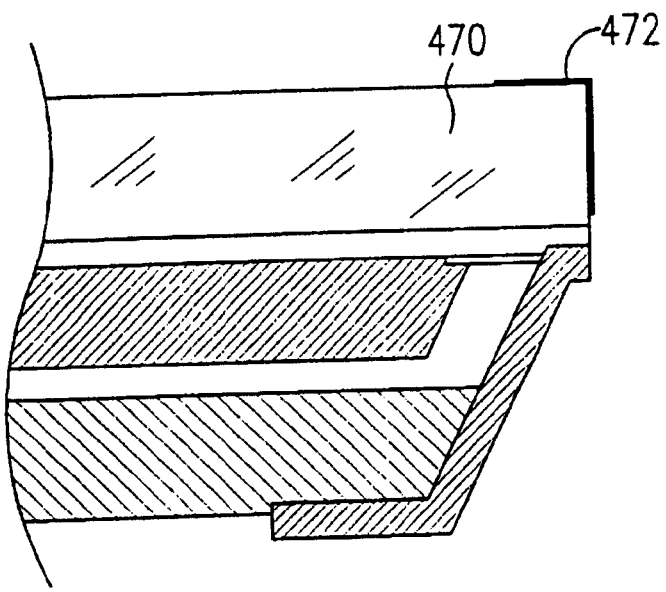

Reference is now made to FIGS. 20A and 20B, which are simplified pictorial illustrations of two alternative embodiments of an integrally packaged optronic integrated circuit device constructed and operative in accordance with yet another preferred embodiment of the present invention wherein edges of the package are coated with an opaque coating.

The embodiment of FIG. 20A may correspond to that of FIG. 19A wherein the transparent protective layer 460 may be provided with an opaque coating 464 at its peripheral edge which may cover step 462 and may also cover the edge of the outer facing surface adjacent thereto.

The embodiment of FIG. 20B may correspond generally to that of FIG. 11A wherein a transparent protective layer 470 may be provided with an opaque coating 472 at its peripheral edge which may also cover the edge of the outer facing surface adjacent thereto.

Figure 21:
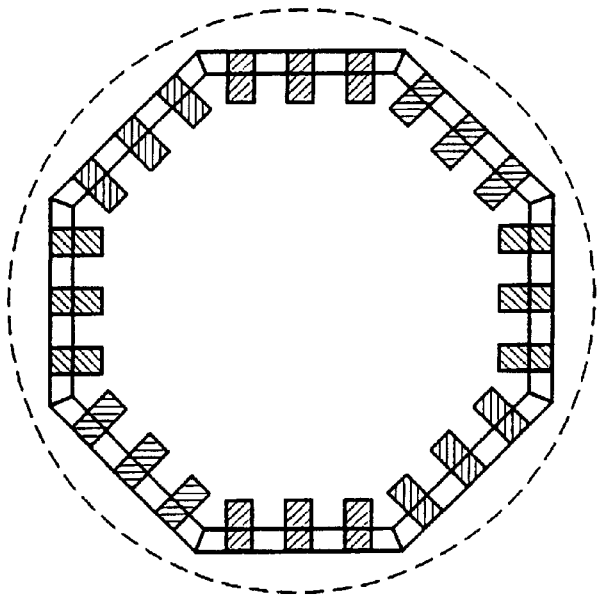
FIG. 21 is a simplified pictorial illustration of an integrally packaged optronic integrated circuit device constructed and operative in accordance with still another preferred embodiment of the present invention and having an octagonal configuration.

Reference is now made to FIG. 21, which is a simplified pictorial illustration of an integrally packaged optronic integrated circuit device constructed and operative in accordance with still another preferred embodiment of the present invention and having an octagonal configuration. This configuration is preferred for compact applications, such as endoscopes which a high density of focal plane sensors and electronics is required.

Figure 22:
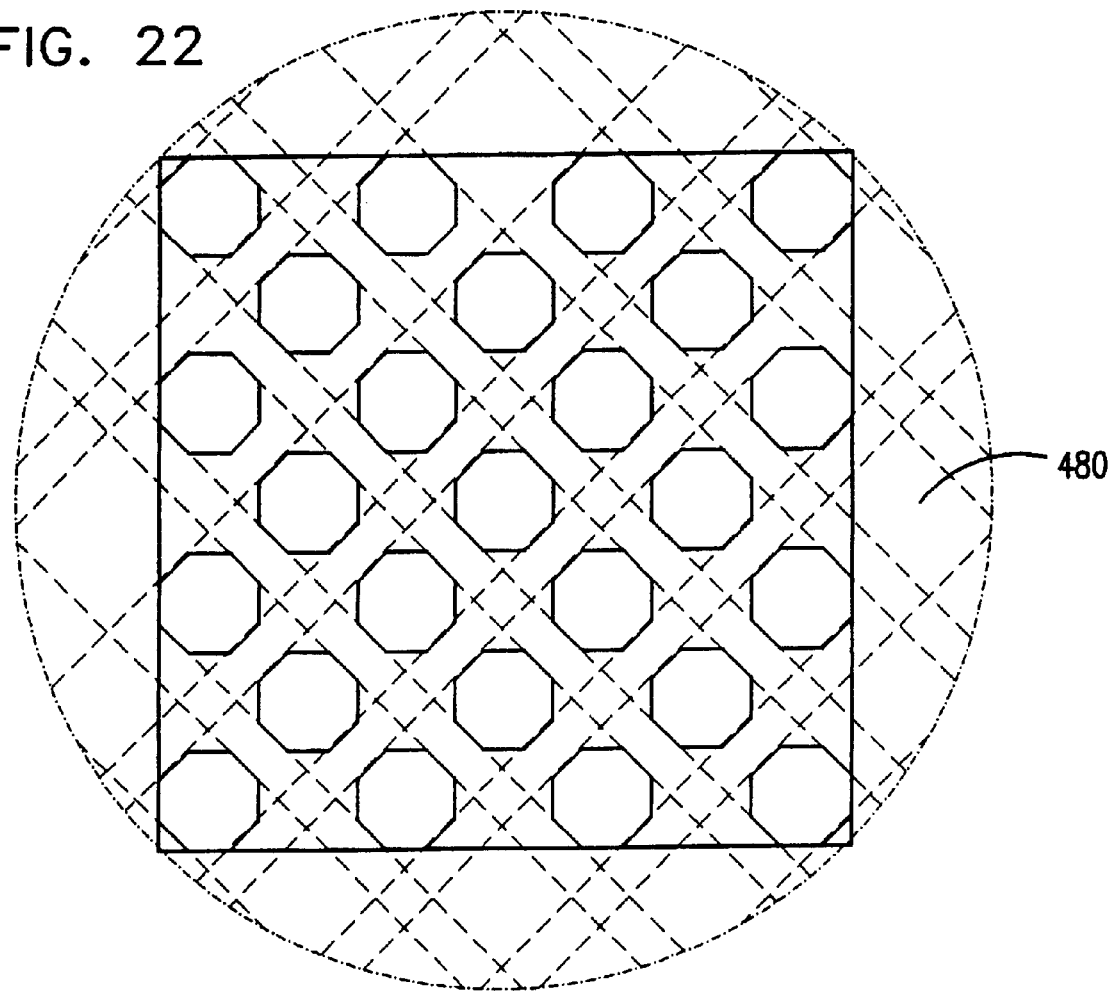
FIG. 22 is a simplified pictorial illustration of a cutting pattern employed to produce integrated circuits of the type shown in FIG. 21.

FIG. 22 is a simplified pictorial illustration of a cutting pattern employed to produce integrated circuits of the type shown in FIG. 21. The cutting pattern of FIG. 22, which is shown overlaid on a wafer 480, comprises six consecutive cuts for each die.

It will be appreciated by persons skilled in the art that the present invention is not limited to what has been particularly shown and described hereinabove. Rather the scope of the present invention includes both combinations and subcombinations of the various features described hereinabove as well as modifications and variations thereof as would occur to a person of skill in the art upon reading the foregoing specification and which are not in the prior art.

What is claimed is:

1. An integrally packaged optronic integrated circuit device including:
   an integrated circuit die containing: at least one of a radiation emitter and radiation receiver, said integrated circuit die having top and bottom surfaces formed of electrically insulative and mechanically protective material, at least one of the surfaces being transparent to radiation; and electrically insulative edge surfaces having pads,
   the pads comprising contacts extending onto said at least one of the top and bottom surfaces.

2. An integrally packaged optronic integrated circuit device according to claim 1 and also including at least one spectral filter associated with a radiation transparent protective surface thereof.

3. An integrally packaged optronic integrated circuit device according to claim 1 and also including color array filters.

4. An integrally packaged optronic integrated circuit device according to claim 1 and also having lenses integrally formed on a transparent protective surface thereof.

5. An integrally packaged optronic integrated circuit device according to claim 1 and also including light coupling bumps formed on a transparent protective surface thereof.

6. An integrally packaged optronic integrated circuit device according to claim 1 and also including a waveguide and other optical components integrally formed on a transparent protective surface thereof.

7. An integrally packaged optronic integrated circuit device according to claim 1 and also including an optical grating formed onto a transparent protective surface thereof.

8. An integrally packaged optronic integrated circuit device according to claim 1 and also including a polarizer integrated therewith.

9. An integrally packaged optronic integrated circuit device according to claim 1, the integrated circuit die having a plurality of dimensions including a longest dimension of the die, said integrally packaged optronic integrated circuit device having a plurality of dimensions including a longest dimension of the device, wherein the longest dimension of the device does not exceed the longest dimension of the die by more than 20%.

10. An integrally packaged optronic integrated circuit device according to claim 9 and being characterized in that the longest dimension of the device does not exceed the longest dimension of the die by more than 10%.

11. An integrally packaged optronic integrated circuit device according to claim 9 and being characterized in that the longest dimension of the device does not exceed the longest dimension of the die by more than 5%.

12. An integrally packaged optronic integrated circuit device according to claim 4 and wherein said lenses are formed of the same material as that of the transparent protective surface.

13. An integrally packaged optronic integrated circuit device according to claim 4 and wherein said lenses are not formed of the same material as that of the transparent protective surface.

14. An integrally packaged optronic integrated circuit device according to claim 4 and wherein said lenses are formed on an outer facing surface of the transparent protective surface.

15. An integrally packaged optronic integrated circuit device according to claim 4 and wherein said lenses are formed on an inner facing surface of the transparent protective surface.

16. An integrally packaged optronic integrated circuit device according to claim 1 and wherein said circuit device is formed with an octagonal shape.

17. A method for producing an integrally packaged optronic integrated surface device comprising the steps of:
   forming electrical circuits onto a semiconductor wafer;
   forming at least one transparent mechanical protective layer onto said semiconductor wafer over said electrical circuits;
   forming solderable contacts onto said semiconductor wafer; and
   thereafter, dicing said wafer into individual packages dies,
   wherein said mechanical protective layer comprises at least one planar surface and wherein said step of forming at least one transparent mechanical protective layer comprises providing contacts extending onto the at least one planar surface.

18. An integrally packaged optronic integrated circuit device according to claim 12 wherein said lenses are formed on an outer facing surface of the transparent protective surface.

19. An integrally packaged optronic integrated circuit device according to claim 13 and wherein said lenses are formed on an outer facing surface of the transparent protective surface.

20. An integrally packaged optronic integrated circuit device according to claim 12 and wherein said lenses are formed on an inner facing surface of the transparent protective surface.

21. An integrally packaged optronic integrated circuit device according to claim 13 and wherein said lenses are formed on an inner facing surface of the transparent protective surface.

22. An integrally packaged optronic integrated circuit device according to claim 9 and wherein said circuit device is formed with an octagonal shape.

23. A device according to claim 1, wherein the contacts extend onto a surface, wherein said surface faces away from an integrated circuit surface on which optronic components are formed.

* * * * *

UNITED STATES PATENT AND TRADEMARK OFFICE
CERTIFICATE OF CORRECTION

PATENT NO. : 6,646,289 B1  Page 1 of 1
APPLICATION NO. : 09/601895
DATED : November 11, 2003
INVENTOR(S) : Badehi It is certified that error appears in the above-identified patent and that said Letters Patent is hereby corrected as shown below:

Column 12, line 38 after "an" insert --individually packaged--.
Column 12, line 39, after "said" insert --individually packaged--
Column 12, line 40, after "having" insert --formed thereon at least one transparent mechanical protective layer comprising--
Column 12, line 45, after "comprising" insert --solderable--.
Column 12, line 46, after "surfaces" insert --of the at least one transparent mechanical protective layer,
wherein said individually packaged integrated circuit die is generated by forming electrical circuits onto a semiconductor water, forming said at least one transparent mechanical protective layer onto said semiconductor wafer over said electrical circuits, forming solderable contact onto said semiconductor wafer; and thereafter, dicing said wafer into individually packaged dies, wherein said mechanical protective layer comprises at least one planar surface and wherein said step of forming at least one transparent mechanical protective layer comprises providing contacts extending onto the at least one planar surface--

Signed and Sealed this

Seventeenth Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 6,646,289 B1  
APPLICATION NO. : 09/601895  
DATED : November 11, 2003  
INVENTOR(S) : Badehi Page 1 of 1

It is certified that error appears in the above-identified patent and that said Letters Patent is hereby corrected as shown below:

Column 12, line 41 after "an" insert --individually packaged--.
Column 12, line 42, after "said" insert --individually packaged--
Column 12, line 43, after "having" insert --formed thereon at least one transparent mechanical protective layer comprising--
Column 12, line 48, after "comprising" insert --solderable--.
Column 12, line 49, after "surfaces" insert --of the at least one transparent mechanical protective layer,
wherein said individually packaged integrated circuit die is generated by forming electrical circuits onto a semiconductor water, forming said at least one transparent mechanical protective layer onto said semiconductor wafer over said electrical circuits, forming solderable contact onto said semiconductor wafer; and thereafter, dicing said wafer into individually packaged dies, wherein said mechanical protective layer comprises at least one planar surface and wherein said step of forming at least one transparent mechanical protective layer comprises providing contacts extending onto the at least one planar surface--

This certificate supersedes Certificate of Correction issued April 17, 2007.

Signed and Sealed this

Seventh Day of August, 2007

JON W. DUDAS  
*Director of the United States Patent and Trademark Office*